US010748630B2

(12) United States Patent
Tran et al.

(10) Patent No.: US 10,748,630 B2
(45) Date of Patent: Aug. 18, 2020

(54) HIGH PRECISION AND HIGHLY EFFICIENT TUNING MECHANISMS AND ALGORITHMS FOR ANALOG NEUROMORPHIC MEMORY IN ARTIFICIAL NEURAL NETWORKS

(71) Applicant: Silicon Storage Technology, Inc., San Jose, CA (US)

(72) Inventors: Hieu Van Tran, San Jose, CA (US); Vipin Tiwari, Dublin, CA (US); Nhan Do, Saratoga, CA (US); Steven Lemke, Boulder Creek, CA (US); Santosh Hariharan, San Jose, CA (US); Stanley Hong, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/826,345

(22) Filed: Nov. 29, 2017

(65) Prior Publication Data

US 2019/0164617 A1 May 30, 2019

(51) Int. Cl.
*G11C 16/10* (2006.01)
*G11C 16/34* (2006.01)

(52) U.S. Cl.
CPC .......... *G11C 16/3459* (2013.01); *G11C 16/10* (2013.01)

(58) Field of Classification Search
CPC .................................................. G11C 11/5628
USPC ..................................................... 365/185.19
See application file for complete search history.

(56) References Cited

U.S. PATENT DOCUMENTS

| | | | |
|---|---|---|---|
| 4,810,910 | A | 3/1989 | Schoellikopf et al. |
| 4,961,002 | A | 10/1990 | Tam et al. |
| 5,029,130 | A | 7/1991 | Yeh |
| 5,097,441 | A | 3/1992 | Soo-In et al. |
| 5,138,576 | A | 8/1992 | Madurawe |
| 5,146,602 | A | 9/1992 | Holler |
| 5,256,911 | A | 10/1993 | Holler |
| 5,264,734 | A | 11/1993 | Holler |
| 5,336,936 | A | 8/1994 | Allen et al. |
| 5,386,132 | A | 1/1995 | Wong |
| 5,469,397 | A | 11/1995 | Hoshino |
| 5,554,874 | A | 9/1996 | Doluca |

(Continued)

FOREIGN PATENT DOCUMENTS

| | | | |
|---|---|---|---|
| EP | 0566739 | A1 | 10/1993 |
| EP | 0562737 | B1 | 6/1998 |
| JP | H03-018985 | A | 1/1991 |

OTHER PUBLICATIONS

U.S. Appl. No. 16/382,013 entitled "Neural Network Classifier Using Array of Two-Gate Non-volatile Memory Cells," Tran et al, filed Apr. 11, 2019.

(Continued)

*Primary Examiner* — Min Huang
(74) *Attorney, Agent, or Firm* — DLA Piper LLP US

(57) ABSTRACT

An artificial neural network device that utilizes analog neuromorphic memory that comprises one or more non-volatile memory arrays. The embodiments comprise improved mechanisms and algorithms for tuning the non-volatile memory arrays such that the floating gates of the memory cells can be quickly and accurately injected with the desired amount of charge to signify an analog value utilized as a weight by the artificial neural network.

10 Claims, 50 Drawing Sheets

(56) References Cited

U.S. PATENT DOCUMENTS

| | | | | |
|---|---|---|---|---|
| 5,621,336 | A | 4/1997 | Shibata et al. | |
| 5,643,814 | A | 7/1997 | Chung | |
| 5,721,702 | A | 2/1998 | Briner | |
| 5,914,894 | A | 6/1999 | Diorio | |
| 6,222,777 | B1 | 4/2001 | Khieu | |
| 6,683,645 | B1 | 1/2004 | Collins et al. | |
| 6,747,310 | B2 | 6/2004 | Fan et al. | |
| 6,829,598 | B2 | 12/2004 | Milev | |
| 7,315,056 | B2 | 1/2008 | Klinger et al. | |
| 7,868,375 | B2 | 1/2011 | Liu et al. | |
| 2002/0089014 | A1 | 7/2002 | Chern | |
| 2003/0034510 | A1 | 2/2003 | Liu | |
| 2003/0183871 | A1* | 10/2003 | Dugger | G06G 7/12 257/314 |
| 2004/0095809 | A1 | 5/2004 | Sakamoto | |
| 2004/0125655 | A1 | 7/2004 | Tsai | |
| 2004/0156241 | A1 | 8/2004 | Mokhlesi | |
| 2005/0087892 | A1 | 4/2005 | Hsu | |
| 2006/0104120 | A1* | 5/2006 | Hemink | G11C 11/5628 365/185.28 |
| 2006/0170038 | A1 | 8/2006 | Wong | |
| 2007/0171756 | A1 | 7/2007 | Lambrache | |
| 2009/0103361 | A1* | 4/2009 | Wang | G11C 11/5628 365/185.03 |
| 2009/0109760 | A1 | 4/2009 | Nazarian | |
| 2010/0046299 | A1 | 2/2010 | Roohparvar | |
| 2010/0290292 | A1 | 11/2010 | Tanizaki et al. | |
| 2012/0087188 | A1 | 4/2012 | Hsieh et al. | |
| 2013/0044544 | A1* | 2/2013 | Shiino | G11C 11/5628 365/185.17 |
| 2013/0100756 | A1 | 4/2013 | Liao et al. | |
| 2014/0054667 | A1* | 2/2014 | Tkachev | H01L 21/28273 257/315 |
| 2014/0269062 | A1 | 9/2014 | Do | |
| 2014/0310220 | A1 | 10/2014 | Chang | |
| 2015/0106315 | A1 | 4/2015 | Birdwell | |
| 2015/0213898 | A1 | 7/2015 | Do | |
| 2015/0262055 | A1 | 9/2015 | Akopyan | |
| 2016/0042790 | A1 | 2/2016 | Tran | |
| 2016/0093382 | A1* | 3/2016 | Sakamoto | G11C 16/10 365/185.19 |
| 2016/0133639 | A1 | 5/2016 | Tran | |
| 2016/0180945 | A1* | 6/2016 | Ng | G11C 11/5628 365/185.03 |
| 2016/0254269 | A1 | 9/2016 | Kim et al. | |
| 2017/0337466 | A1* | 11/2017 | Bayat | G06N 3/0454 |
| 2017/0337971 | A1 | 11/2017 | Tran et al. | |
| 2017/0337980 | A1 | 11/2017 | Guo et al. | |
| 2018/0004708 | A1 | 1/2018 | Muralimanohar | |
| 2018/0268912 | A1 | 9/2018 | Guo et al. | |
| 2018/0293487 | A1* | 10/2018 | Copel | G06N 3/0635 |
| 2019/0088325 | A1 | 3/2019 | Tiwari et al. | |

OTHER PUBLICATIONS

U.S. Appl. No. 16/382,034 entitled "Neural Network Classifier Using Array of Four-Gate Non-volatile Memory Cells," Tran, et al, filed Apr. 11, 2019.

U.S. Appl. No. 16/382,045 entitled "Neural Network Classifier Using Array of Three-Gate Non-volatile Memory Cells," Tran, et al, filed Apr. 11, 2019.

U.S. Appl. No. 16/382,051 entitled "Neural Network Classifier Using Array of Stacked Gate Non-volatile Memory Cells," Tran, et al, filed Apr. 11, 2019.

U.S. Appl. No. 16/382,060 entitled "Memory Device and Method for Varying Program State Separation Based Upon Frequency of Use," Tran, et al, filed Apr. 11, 2019.

U.S. Appl. No. 16/271,673 entitled "Flash Memory Array With Individual Memory Cell Read, Program and Erase," Guo et al., filed Feb. 8, 2019.

U.S. Appl. No. 15/991,890 entitled "Decoders for Analog Neural Memory in Deep Learning Artificial Neural Network," Tran, et al., filed May 29, 2018.

U.S. Appl. No. 16/353,830 entitled "System for Converting Neuron Current Into Neuron Current-Based Time Pulses . . . Network," Tran et al., filed Mar. 14, 2019.

U.S. Appl. No. 16/353,409, titled "Apparatus and Method for Combining Analog Neural Net With FPGA Routing in a Monolithic Integrated Circuit," filed Mar. 14, 2019.

U.S. Appl. No. 62/797,158, titled "Apparatus and Method for Combining Analog Neural Net With FPGA Routing in a Monolithic Integrated Circuit," filed Jan. 25, 2019.

Jenn-Chyou Bor, et al., "Realization of the CMOS Pulsewidth-Modulation (PWM) Neural Network with On-Chip Learning," IEEE Transactions on Circuits and Systems, Jan. 1998.

Alister Hamilton, et al., "Integrated Pulse Stream Neural Networks: Results, Issues, and Pointers," IEEE Transactions on Neural Networks, May 1992.

Shafiee et al, "Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/-rajeev/pubs/isca16.pdf; pp. 1-4.].

* cited by examiner

FIGURE 36

| | WL | WL -unsel | BL | BL -unsel | SL | SL -unsel |
|---|---|---|---|---|---|---|
| Read | 1-3.5V | -0.5V/0V | 0.6-2V (Ineuron) | 0.6V-2V/0V | 0V | 0V |
| Erase | ~5-13V | 0V | 0V | 0V | 0V | 0V |
| Program | 1-2V | -0.5V/0V | 0.1-3 uA | Vinh ~2.5V | 4-10V | 0-1V/FLT |

| | WL | WL -unsel | BL | BL -unsel | SL | SL -unsel |
|---|---|---|---|---|---|---|
| Read | 1-3.5V | -0.5V/0V | 0.6-2V | 0.6V-2V/0V | ~1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 40

| | WL | WL -unsel | BL | BL -unsel | CG | CG -unsel same sector | CG -unsel | EG | EG -unsel | SL | SL -unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 42

| | WL | WL -unsel | BL | BL -unsel | CG | CG -unsel same sector | CG -unsel | EG | EG -unsel | SL | SL -unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 46

Uniform Step Algorithm
4600

| | | | |
|---|---|---|---|
| V target | | 8 | V |
| V start | | 4 | V |
| Uniform step | | | |
| | step size | 0.01 | V |
| | # steps | 400 | |
| Total # steps: | | 400 | |

FIGURE 47

Uniform Log Step
Coarse/Fine Algorithm
4700

| | | |
|---|---|---|
| V target | | 8 V |
| V start | | 4 V |
| Coarse - uniform step | | |
| | step size | 0.4 V |
| | # steps | 10 |
| | | |
| Fine 1 | Istepdown | 0.2 V |
| | step size | 0.1 V |
| | # steps | 6 |
| | | |
| Fine 2 | Istepdown | 0.1 V |
| | step size | 0.01 V |
| | # steps | 20 |
| | | |
| | | |
| Total # steps: | | 46 |

FIGURE 48

Binary Search Step
Coarse/Fine Algorithm
4800

| | | | |
|---|---|---|---|
| V target | | 8 | V |
| V start | | 4 | V |
| Coarse -binary search step | | | |
| | step1 | 2 | V |
| | step2 | 1 | V |
| | step3 | 0.5 | V |
| | step4 | 0.25 | V |
| | step5 | 0.125 | V |
| | step6 | 0.0625 | V |
| | | | |
| Fine 1 | Istepdown | 0.0625 | V |
| | step size | 0.01 | V |
| | # steps | 19 | |
| | | | |
| | | | |
| | | 25 | |

HIGH PRECISION AND HIGHLY EFFICIENT TUNING MECHANISMS AND ALGORITHMS FOR ANALOG NEUROMORPHIC MEMORY IN ARTIFICIAL NEURAL NETWORKS

FIELD OF THE INVENTION

Numerous embodiments for tuning cells within an analog neuromorphic memory used in an artificial neural network are disclosed.

BACKGROUND OF THE INVENTION

Artificial neural networks mimic biological neural networks (the central nervous systems of animals, in particular the brain) which are used to estimate or approximate functions that can depend on a large number of inputs and are generally unknown. Artificial neural networks generally include layers of interconnected "neurons" which exchange messages between each other. FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells are configured to multiply the first plurality of inputs by the stored weight values to generate the first plurality of outputs.

Each non-volatile memory cells used in the analog neuromorphic must be erased and programmed to hold a very specific and precise amount of charge in the floating gate. For example, each floating gate must hold one of N different values, where N is the number of different weights that can be indicated by each cell. Examples of N include 16, 32, and 64. The prior art lacks a fast and accurate mechanism for tuning each cell to ensure that the cell contains the desired amount of charge.

What is needed are improved mechanisms and algorithms for tuning an analog neuromorphic memory used in artificial neural networks.

BRIEF DESCRIPTION OF THE DRAWINGS

FIG. 36 depicts operating voltages to perform operations on the non-volatile memory cells of FIG. 35.

FIG. 38 depicts operating voltages to perform operations on the non-volatile memory cells of FIG. 37.

FIG. 40 depicts operating voltages to perform operations on the non-volatile memory cells of FIG. 39.

FIG. 42 depicts operating voltages to perform operations on the non-volatile memory cells of FIG. 41.

FIG. 46 depicts a uniform step algorithm for tuning a non-volatile memory cell.

FIG. 47 depicts a uniform log step algorithm comprising coarse and fine steps for tuning a non-volatile memory cell.

FIG. 48 depicts a binary search step algorithm comprising coarse and fine steps for tuning a non-volatile memory cell.

DETAILED DESCRIPTION OF THE INVENTION

Figure 2:
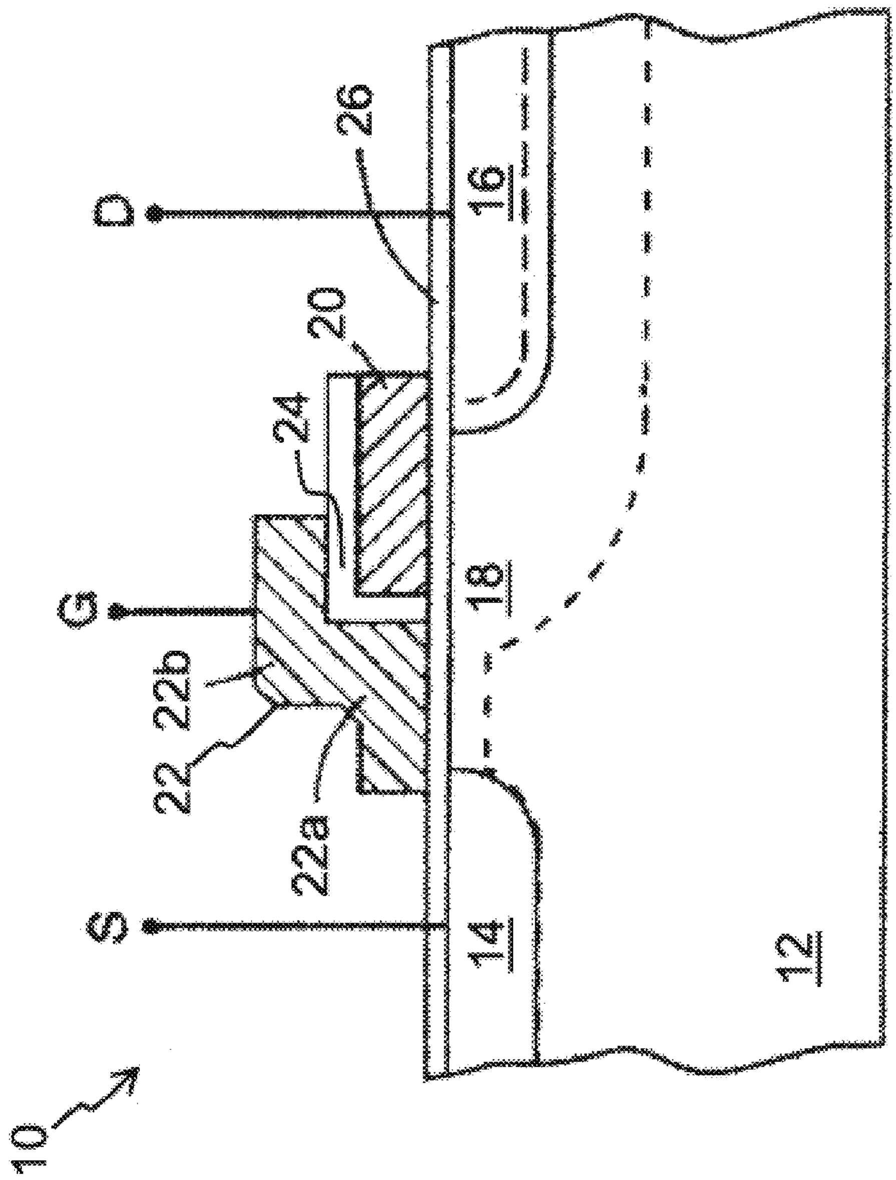
FIG. 2 is a side cross sectional view of conventional 2-gate non-volatile memory cell.

The artificial neural networks of the present invention utilize a combination of CMOS technology and non-volatile memory arrays. Digital non-volatile memories are well known. For example, U.S. Pat. No. 5,029,130 ("the '130 patent") discloses an array of split gate non-volatile memory cells, and is incorporated herein by reference for all purposes. The memory cell is shown in FIG. 2. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22*a* that is disposed over and insulated from (and controls the conductivity of) a second portion of the channel region 18, and a second portion 22*b* that extends up and over the floating gate 20. The floating gate 20 and control gate 22 are insulated from the substrate 12 by a gate oxide 26.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell is read by placing positive read voltages on the drain 16 and control gate 22 (which turns on the channel region under the control gate). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Figure 3:
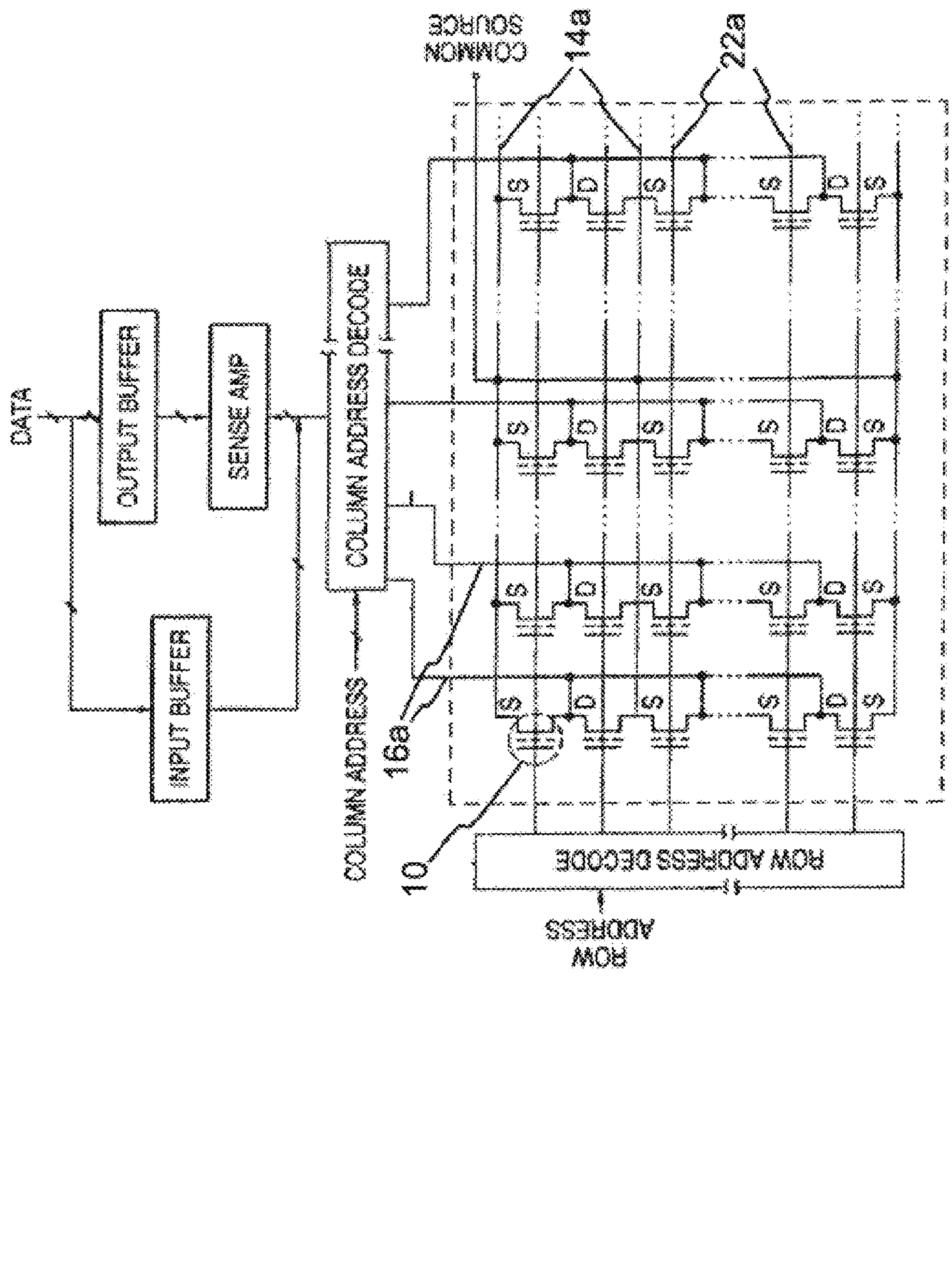
FIG. 3 is a diagram illustrating a conventional array architecture for the memory cell of FIG. 2.

The architecture of the prior art memory array is shown in FIG. 3. The memory cells 10 are arranged in rows and columns. In each column, the memory cells are arranged end to end in mirror fashion, so that they are formed as pairs of memory cells each sharing a common source region 14 (S), and each adjacent set of memory cell pairs sharing a common drain region 16 (D). All the source regions 14 for any given row of memory cells are electrically connected together by a source line 14*a*. All the drain regions 16 for any given column of memory cells are electrically connected together by a bit line 16*a*. All the control gates 22 for any given row of memory cells are electrically connected together by a control gate line 22*a*. Therefore, while the memory cells can be individually programmed and read, memory cell erasure is performed row by row (each row of memory cells is erased together, by the application of a high voltage on the control gate line 22*a*). If a particular memory cell is to be erased, all the memory cells in the same row are also erased.

Figure 4:
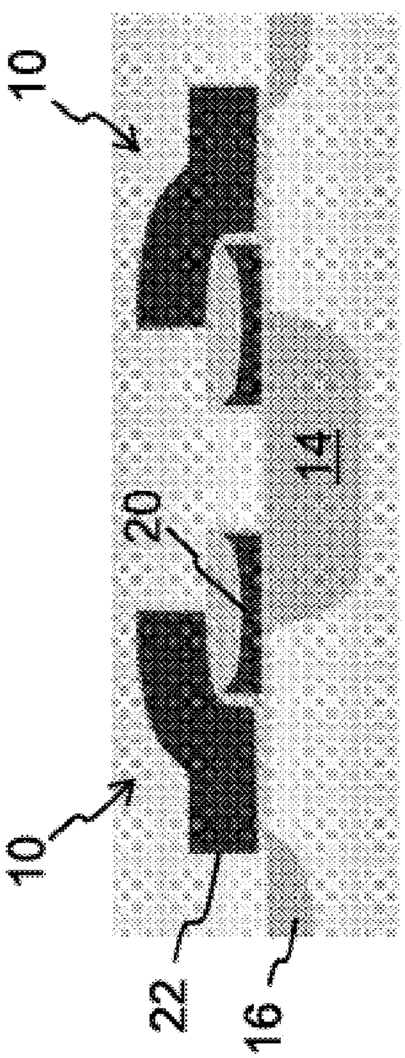
FIG. 4 is a side cross sectional view of conventional 2-gate non-volatile memory cell.
Figure 5:
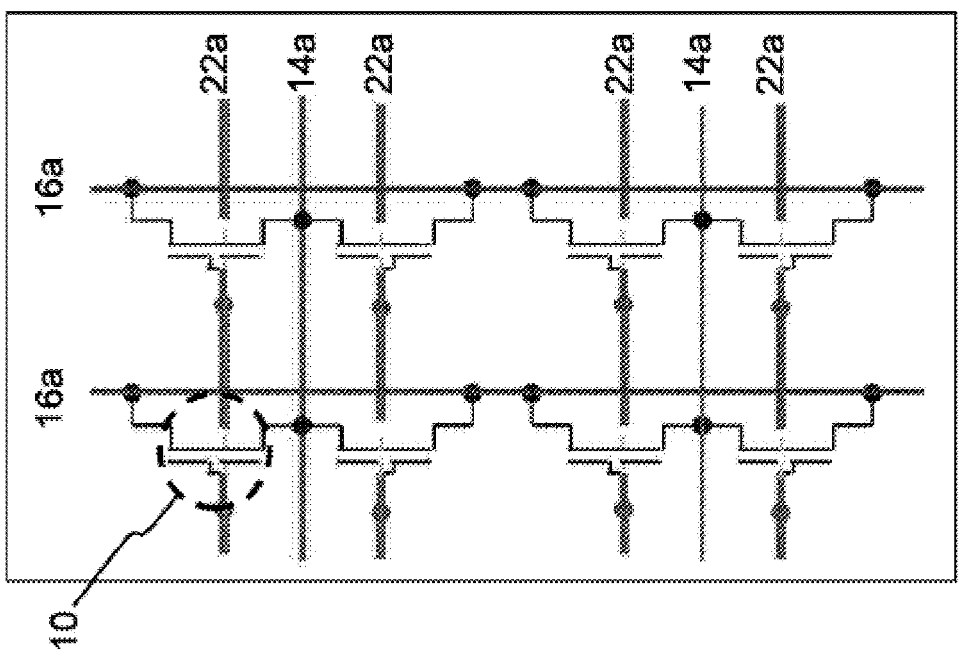
FIG. 5 is a diagram illustrating a conventional array architecture for the memory cell of FIG. 4.

Those skilled in the art understand that the source and drain can be interchangeable, where the floating gate can extend partially over the source instead of the drain, as shown in FIG. 4 (two-gate memory cell). FIG. 5 best illustrates the corresponding memory cell architecture, including the memory cells 10, the source lines 14*a*, the bit lines 16*a*, and the control gate lines 22*a*. As is evident from the figures, memory cells 10 of the same row share the same source line 14*a* and the same control gate line 22*a*, while the drain regions of all cells of the same column are electrically connected to the same bit line 16*a*. The array design is optimized for digital applications, and permits individual programming of the selected cells, e.g., by applying 1.6 V and 7.6 V to the selected control gate line 22*a* and source line 14*a*, respectively, and grounding the selected bit line 16*a*. Disturbing the non-selected memory cell in the same pair is avoided by applying a voltage greater than 2 volts on the unselected bit lines 16*a* and grounding the remaining lines. The memory cells 10 cannot be erased individually because the process responsible for erasure (the Fowler-Nordheim tunneling of electrons from the floating gate 20 to the control gate 22) is only weakly affected by the drain voltage (i.e., the only voltage which may be different for two adjacent cells in the row direction sharing the same source line 14*a*).

Figure 6:
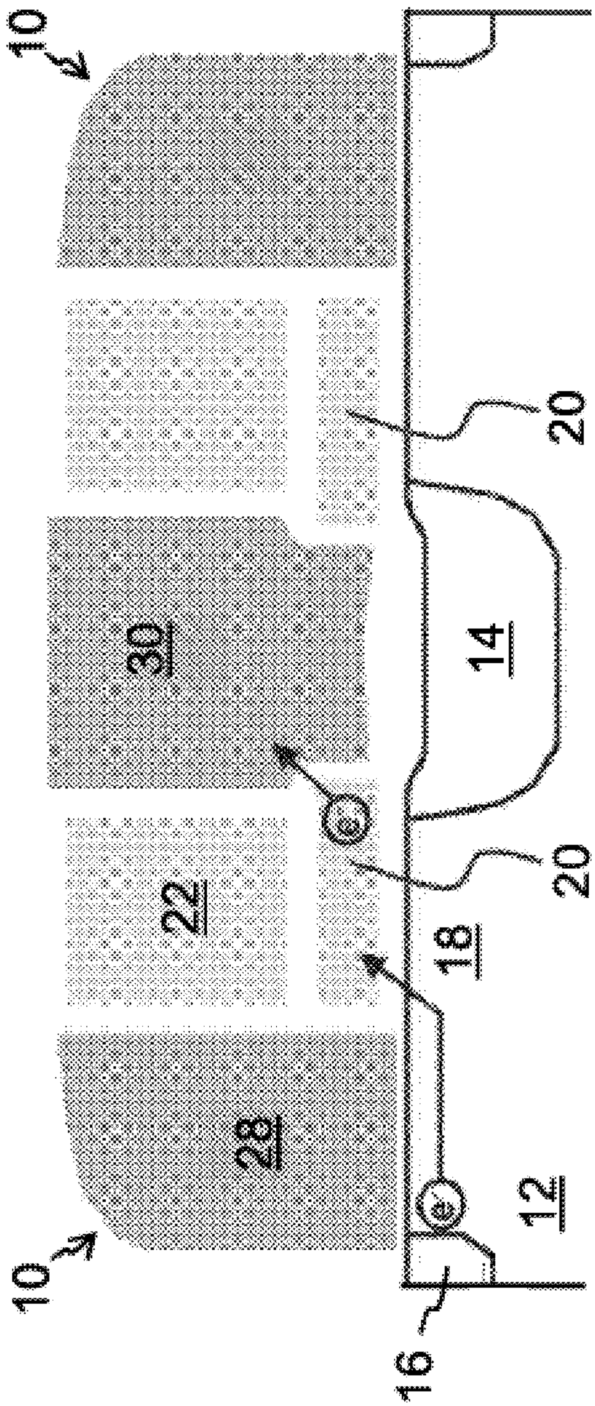
FIG. 6 is a side cross sectional view of conventional 4-gate non-volatile memory cell.

Split gate memory cells having more than two gates are also known. For example, four-gate memory cells have source region 14, drain region 16, floating gate 20 over a first portion of channel region 18, a select gate 28 over a second portion of the channel region 18, a control gate 22 over the floating gate 20, and an erase gate 30 over the source region 14 are known, as shown in FIG. 6 (see for example U.S. Pat. No. 6,747,310), which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Figure 34:
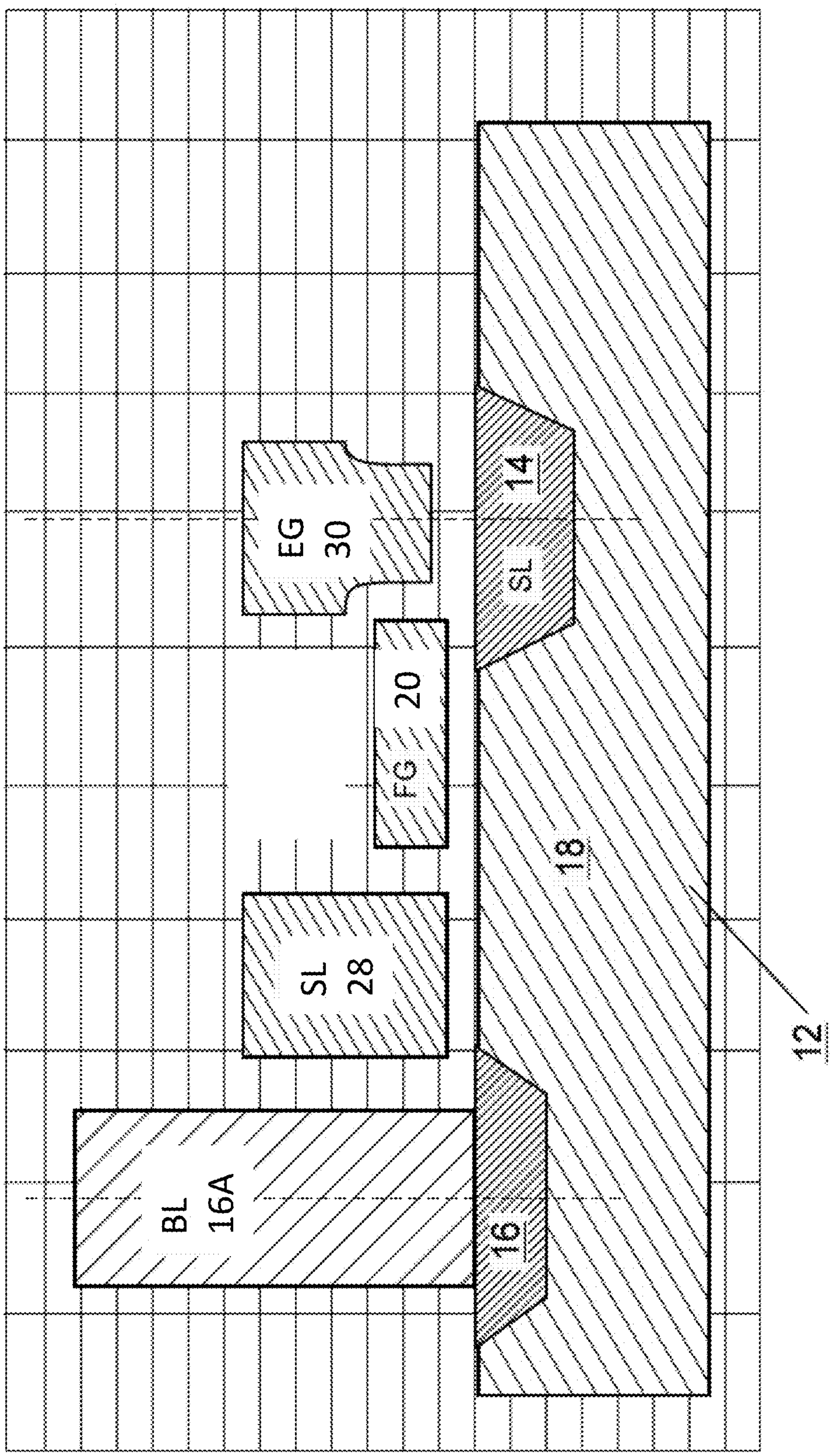
FIG. 34 is a cross-sectional view of a prior art non-volatile memory cell that can be utilized in an artificial neural network.

Another type of prior art split gate three-gate memory cell is shown in FIG. 34. The split gate memory cell of FIG. 34 is identical to the split gate memory cell of FIG. 6 except that it does not have a separate control gate. The erase operation (erasing through erase gate) and read operation are similar to that of the FIG. 6 except there is no control gate bias. The programming operation also is done without the control gate bias, hence the program voltage on the source line is higher to compensate for lack of control gate bias.

Table No. 1 depicts typical voltage ranges that can be applied to the four terminals for performing read, erase, and program operations:

TABLE NO. 1

Operation of Flash Memory Cell of FIG. 34

| | WL | WL- unsel | BL | BL-unsel | EG | EG-unsel | SL | SL-unsel |
|---|---|---|---|---|---|---|---|---|
| Read | 0.7-2.2 V | −0.5 V/0 V | 0.6-2 V | 0 V/FLT | 0-2.6 V | 0-2.6 V | 0 V | 0 V/FLT/VB |
| Erase | −0.5 V/0V | −.5 V/0 V | 0 V | 0 V | 11.5 V | 0-2.6 V | 0 V | 0 V |
| Program | 1-1.5 V | −.5 V/0 V | 1-3 μA | Vinh (~1.8 V) | 4.5 V | 0-2.6 V | 7-9 V | 0-1 V/FLT |

Figure 7:
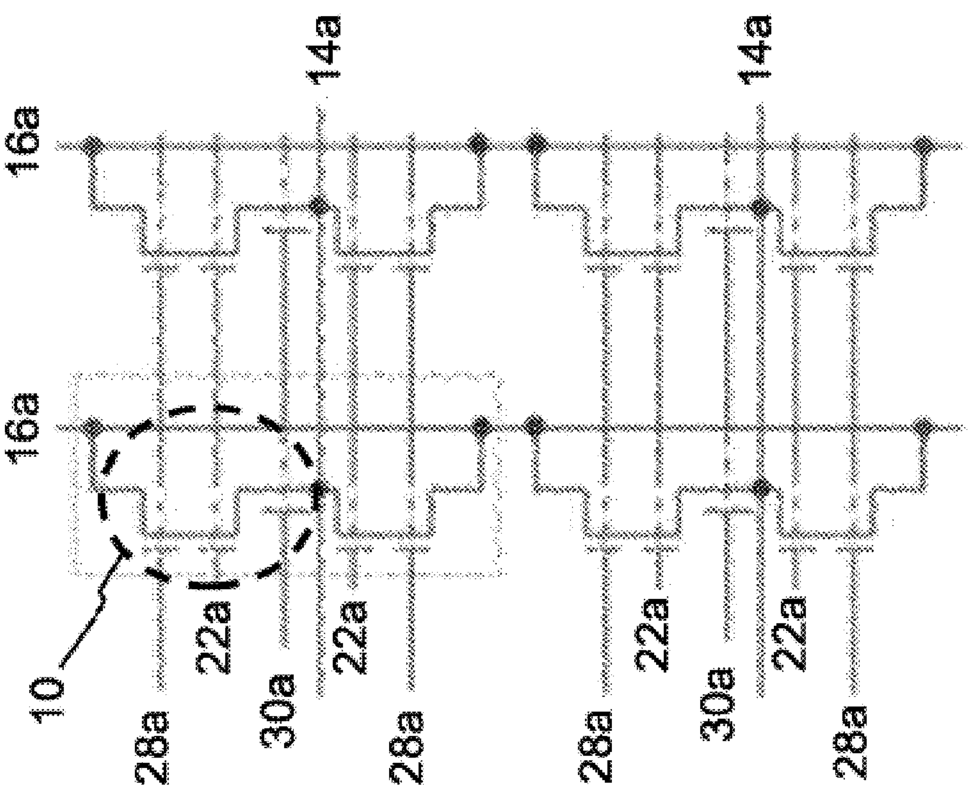
FIG. 7 is a diagram illustrating a conventional array architecture for the memory cell of FIG. 6.

The architecture for a four-gate memory cell array can be configured as shown in FIG. 7. In this embodiment, each horizontal select gate line 28*a* electrically connects together all the select gates 28 for that row of memory cells. Each horizontal control gate line 22*a* electrically connects together all the control gates 22 for that row of memory cells. Each horizontal source line 14*a* electrically connects together all the source regions 14 for two rows of memory cells that share the source regions 14. Each bit line 16*a* electrically connects together all the drain regions 16 for that column of memory cells. Each erase gate line 30*a* electrically connects together all the erase gates 30 for two rows of memory cells that share the erase gate 30. As with the previous architecture, individual memory cells can be independently programmed and read. However, there is no way to erase cells individually. Erasing is performed by placing a high positive voltage on the erase gate line 30*a*, which results in the simultaneous erasing of both rows of the memory cells that share the same erase gate line 30*a*. Exemplary operating voltages can include those in Table 2 below (in this embodiment, select gate lines 28*a* can be referred to as word lines WL):

TABLE 2

| | WL | | BL | | SL | | CG | | EG | |
|---|---|---|---|---|---|---|---|---|---|---|
| | Sel. | Unsel. | Sel. | Unsel. | Sel. | Unsel. | Sel. | Unsel. | Sel. | Unsel. |
| Erase | 0 V | 0 V | 0 V | 0 V | 0 V | 0 V | 0 V | 0 V | 11.5 V | 0 V |
| Read | 2.5 V | 0 V | 0.8 V | 0 V | 0 V | 0 V | 2.5 V | 2.5 V | 0 V | 0 V |
| Program | 1 V | 0 V | 1 μA | 2.5 V | 4.5 V | 0.5 V | 10.5 V | 0/2.5 V | 4.5 V | 0.5 V |

In order to utilize the memory arrays comprising one of the types of non-volatile memory cells described above, two modifications are made. First, the lines are reconfigured so that each memory cell can be individually programmed, erased and read without adversely affecting the memory state of other memory cells in the array, as further explained below. Second, continuous (analog) programming of the memory cells is provided. Specifically, the memory state (i.e. charge on the floating gate) of each memory cells in the array can be continuously changed from a fully erased state to a fully programmed state, and vice versa, independently and with minimal disturbance of other memory cells. This means the cell storage is analog or at the very least can store one of many discrete values (such as 16 or 32 different values), which allows for very precise and individual tuning of all the cells in the memory array, and which makes the memory array ideal for storing and making fine tuning adjustments to the synapsis weights of the neural network.

Memory Cell Programming and Storage

Figure 8B:
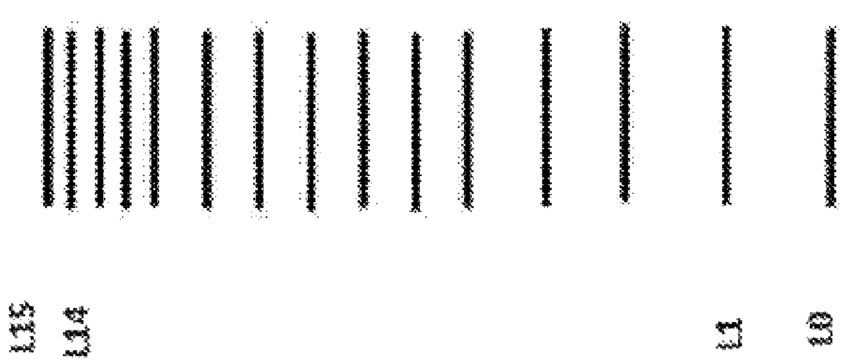
FIG. 8B is a diagram illustrating neural network weight level assignments that are unevenly spaced.
Figure 8A:
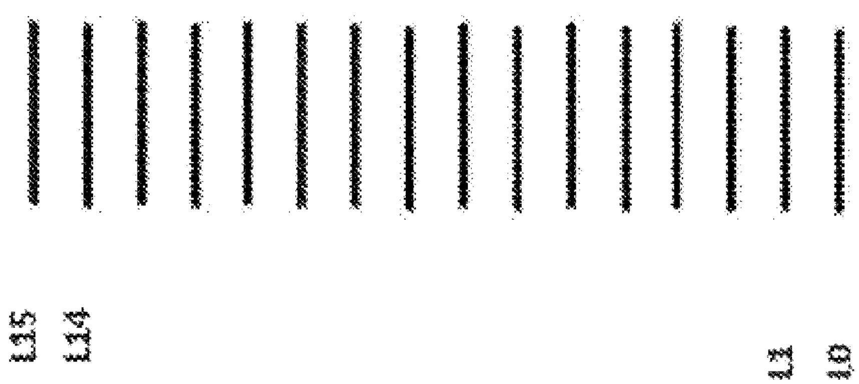
FIG. 8A is a diagram illustrating neural network weight level assignments that are evenly spaced.

The neural network weight level assignments as stored in the memory cells can be evenly spaced as shown in FIG. 8A, or unevenly spaced as shown in FIG. 8B. Programming of the non-volatile memory cells can be implemented using a bidirectional tuning algorithm such as that shown in FIG. 9. Icell is the read current of the target cell being programmed, and Itarget is the desired read current when the cell is ideally programmed. The target cell read current Icell is read (step 1) and compared to the target read current Itarget (step 2). If the target cell read current Icell is greater than the target read current Itarget, a programming tuning process is performed (step 3) to increase the number of electrons on the floating gate (in which a look up table is used to determine the desired programming voltage VCG on the control gate) (steps 3*a*-3*b*), which can be repeated as necessary (step 3*c*). If the target cell read current Icell is less than the target read current Itarget, an erase tuning process is performed (step 4) to decrease the number of electrons on the floating gate (in which a look up table is used to determine the desired erase voltage VEG on the erase gate) (steps 4*a*-4*b*), which can be repeated as necessary (step 4*c*). If a programming tuning process overshoots the target read current, then an erase tuning process is performed (step 3*d* and starting with step 4*a*), and vice versa (step 4*d* and starting with step 3*a*), until the target read current is achieved (within an acceptable delta value).

Figure 9:
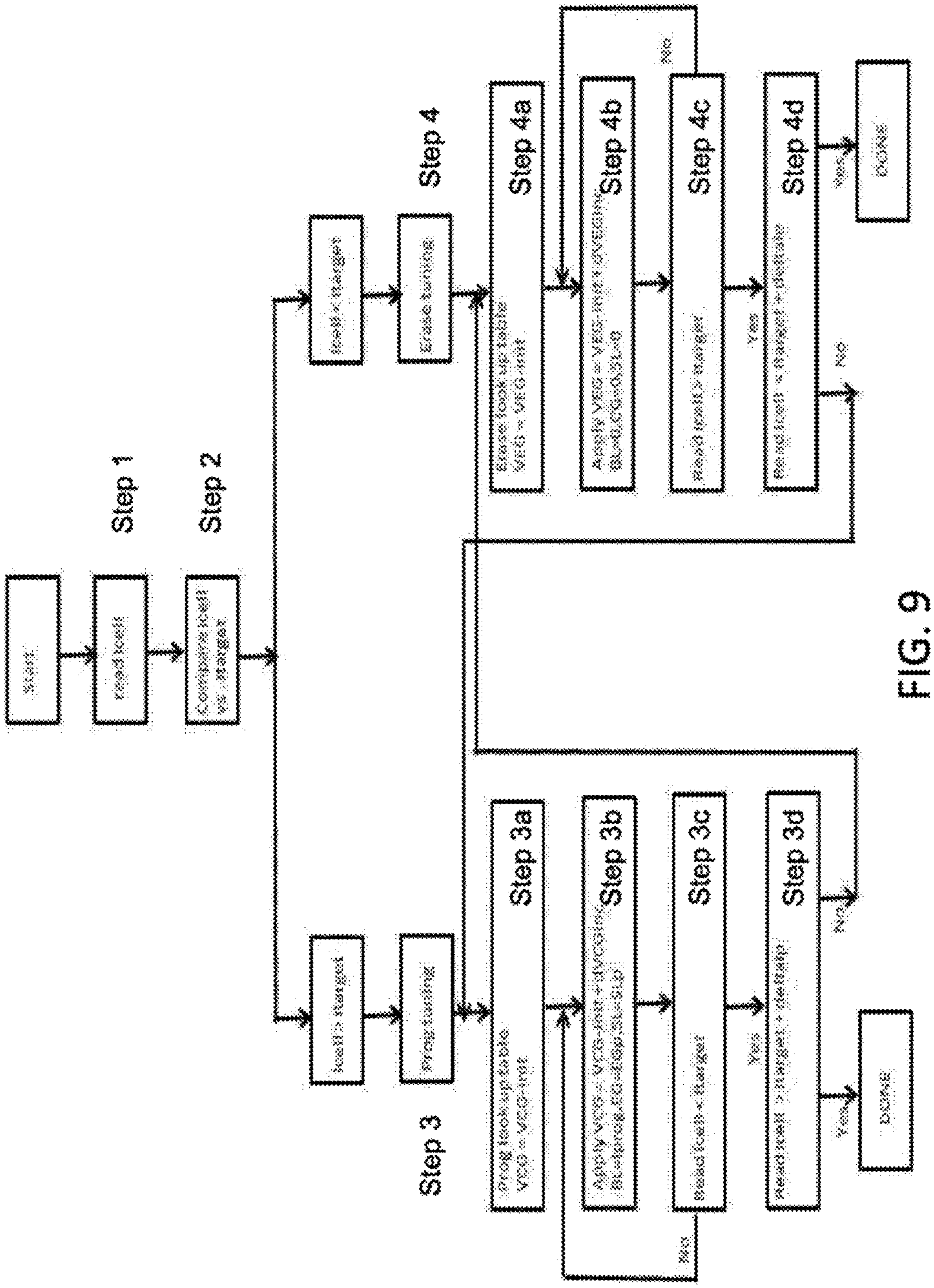
FIG. 9 is a flow diagram illustrating a bidirectional tuning algorithm.

Programming of the non-volatile memory cells can instead be implemented using a unidirectional tuning algorithm using programming tuning. With this algorithm, the memory cell is initially fully erased, and then the programming tuning steps 3*a*-3*c* in FIG. 9 are performed until the read current of the target cell reaches the target threshold value. Alternately, the tuning of the non-volatile memory cells can be implemented using the unidirectional tuning algorithm using erasing tuning. In this approach, the memory cell is initially fully programmed, and then the erasing tuning steps 4*a*-4*c* in FIG. 9 are performed until the read current of the target cell reaches the target threshold value.

Figure 10:
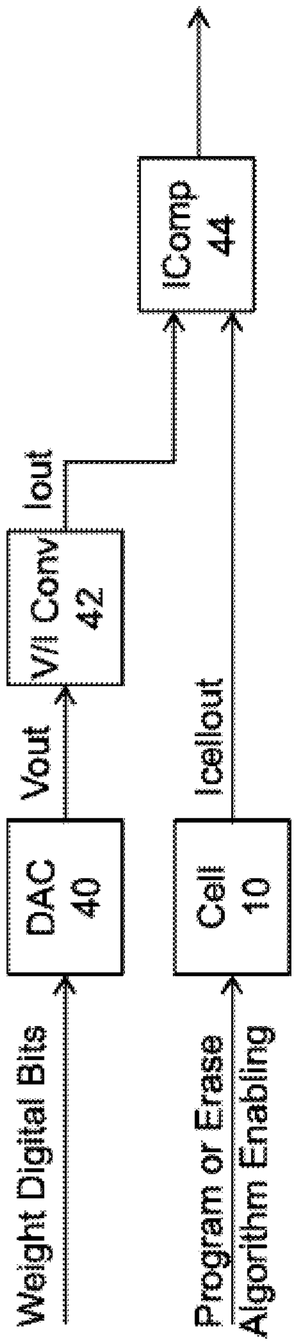
FIG. 10 is a block diagram illustrating weight mapping using current comparison.

FIG. 10 is a diagram illustrating weight mapping using current comparison. The weight digital bits (e.g., 5-bit weight for each synapsis, representing the target digital weight for the memory cell) are input to a digital-to-analog converter (DAC) 40, which converts the bits to voltage Vout (e.g., 64 voltage levels-5 bits). Vout is converted to a current Iout (e.g. 64 current levels-5 bits) by voltage-to-current converter V/I Cony 42. The current is supplied to a current comparator IComp 44. Program or erase algorithm enabling are input to the memory cell 10 (for example, erase: incrementing EG voltage; or program: increment CG voltage). The memory cell current out Icellout (i.e. from a read operation) is supplied to the current comparator IComp 44. The current comparator IComp 44 compares the memory cell current Icellout with the current Iout derived from the weight digital bits to produce a signal indicative of the weight stored in the memory cell 10.

Figure 11:
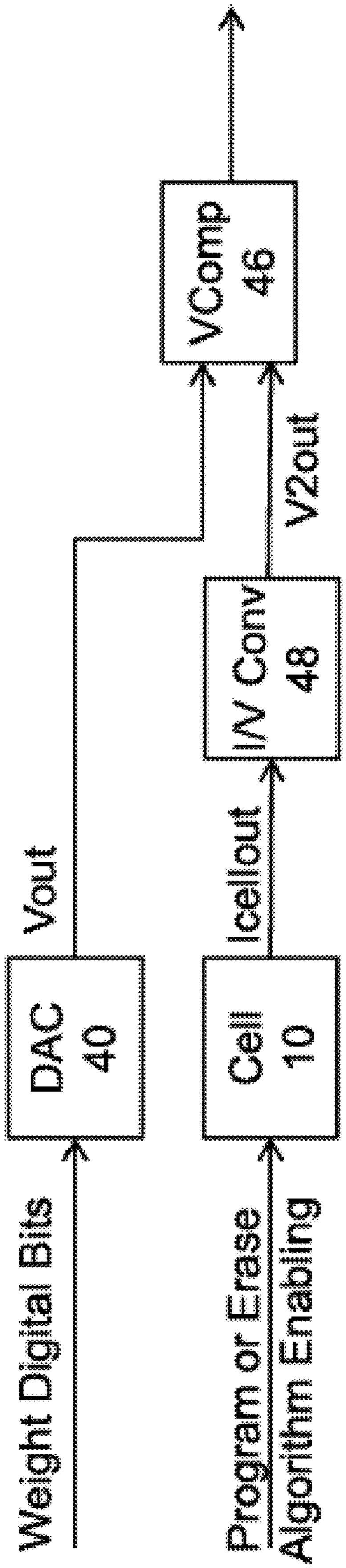
FIG. 11 is a block diagram illustrating weight mapping using voltage comparison.

FIG. 11 is a diagram illustrating weight mapping using voltage comparison. The weight digital bits (e.g., 5-bit weight for each synapsis) are input to a digital-to-analog converter (DAC) 40, which converts the bits to voltage Vout (e.g., 64 voltage levels-5 bits). Vout is supplied to a voltage comparator VComp 46. Program or erase algorithm enabling are input to the memory cell 10 (for example, erase: incrementing EG voltage; or program: increment CG voltage). The memory cell current out Icellout is supplied to current-to-voltage converter I/V Cony 48 for conversion to a voltage V2out (e.g. 64 voltage levels-5 bits). Voltage V2out is supplied to voltage comparator VComp 46. The voltage comparator VComp 46 compares the voltages Vout and V2 out to produce a signal indicative of the weight stored in the memory cell 10.

Neural Networks Employing Non-Volatile Memory Cell Array

Figure 12:
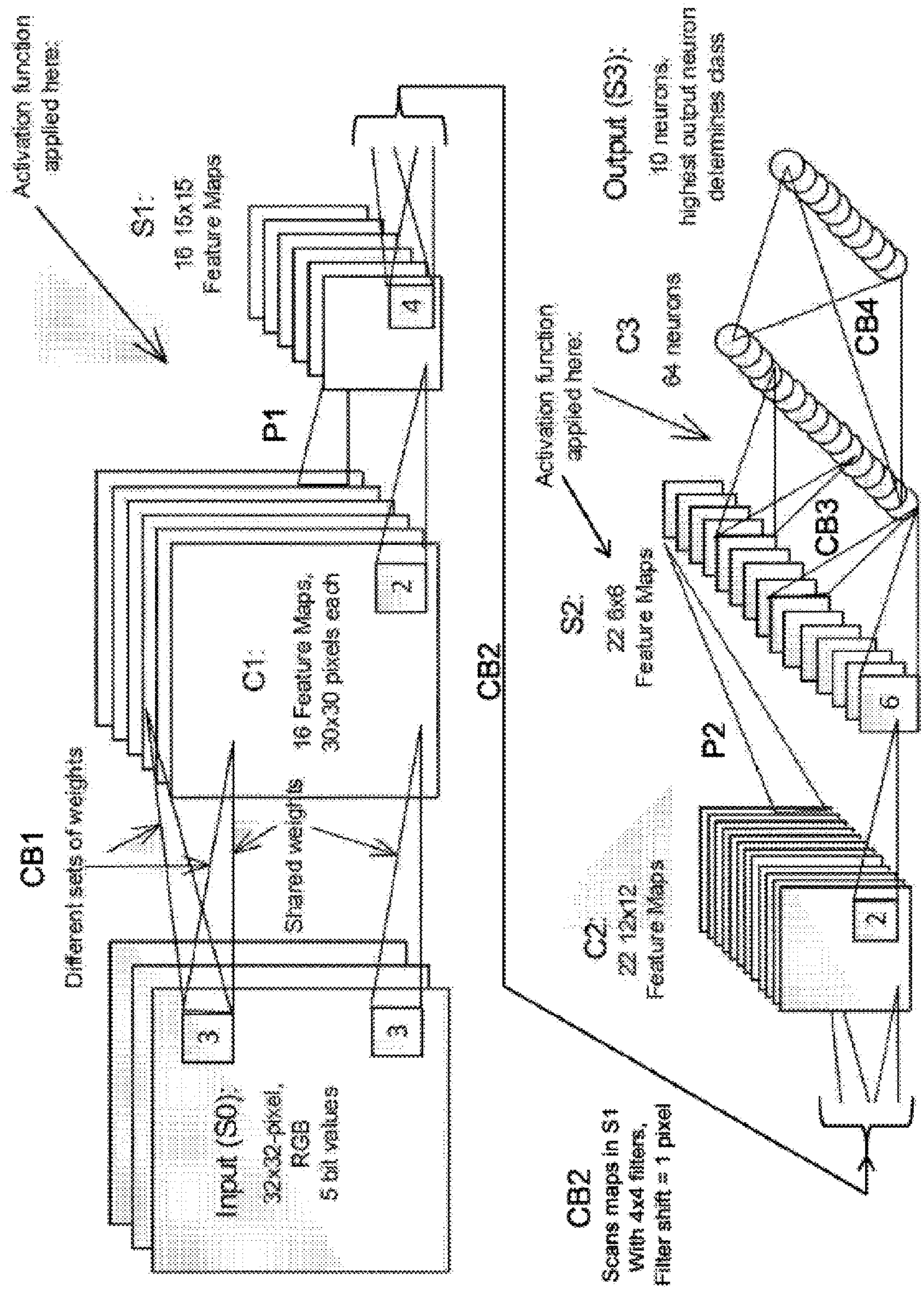
FIG. 12 is a diagram illustrating the different levels of an exemplary neural network utilizing a non-volatile memory array.

FIG. 12 conceptually illustrates a non-limiting example of a neural network utilizing a non-volatile memory array. This example uses the non-volatile memory array neural net for a facial recognition application, but any other appropriate application could be implemented using a non-volatile memory array based neural network. S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 13:
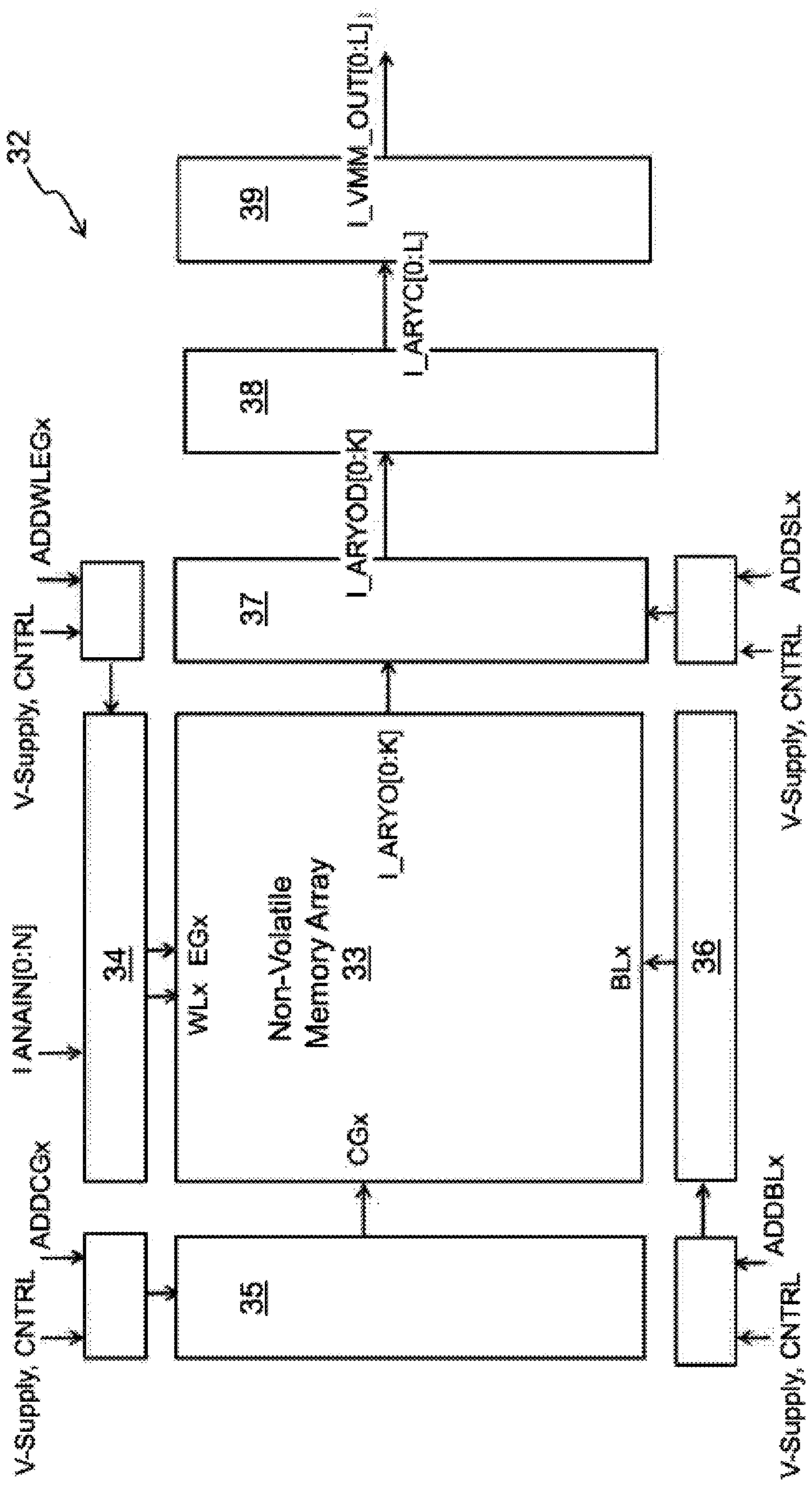
FIG. 13 is a block diagram illustrating a vector multiplier matrix.

Each level of synapses is implemented using an array, or a portion of an array, of non-volatile memory cells. FIG. 13 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. The memory array serves two purposes. First, it stores the weights that will be used by the VMM. Second, the memory array effectively multiplies the inputs by the weights stored in the memory array to produce the output, which will be the input to the next layer or input to the final layer. By performing the multiplication function, the memory array negates the need for separate multiplication logic circuits and is also power efficient due to in-situ memory computation.

The output of the memory array is supplied to a differential summer (such as summing op-amp) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tan h, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 14:
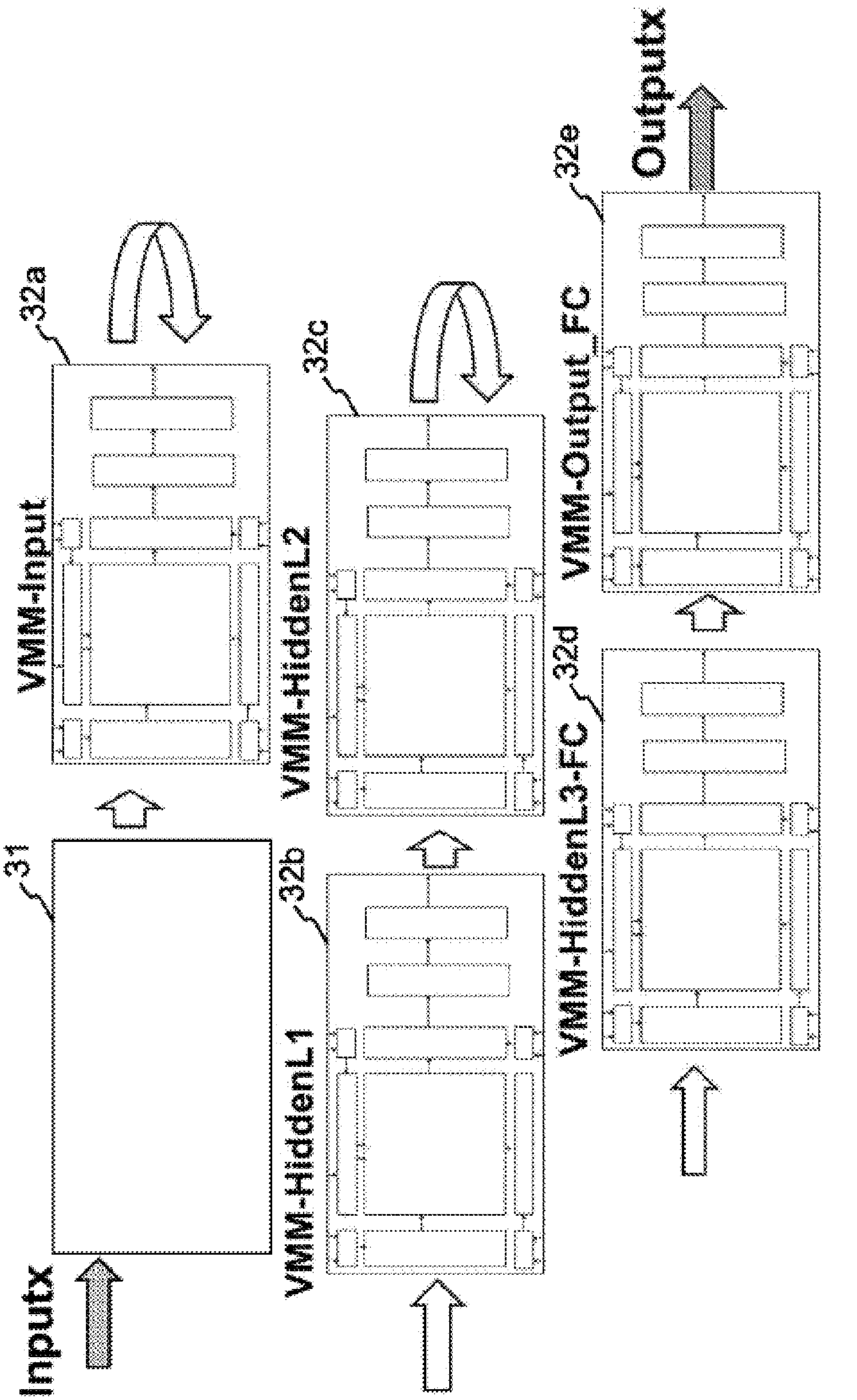
FIG. 14 is a block diagram illustrating various levels of a vector multiplier matrix.

FIG. 14 is a block diagram of the various levels of VMM. As shown in FIG. 14, the input is converted from digital to analog by digital-to-analog converter 31, and provided to input VMM 32*a*. The output generated by the input VMM 32*a* is provided as an input to the next VMM (hidden level 1) 32*b*, which in turn generates an output that is provided as an input to the next VMM (hidden level 2) 32*b*, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array.

Figure 15:
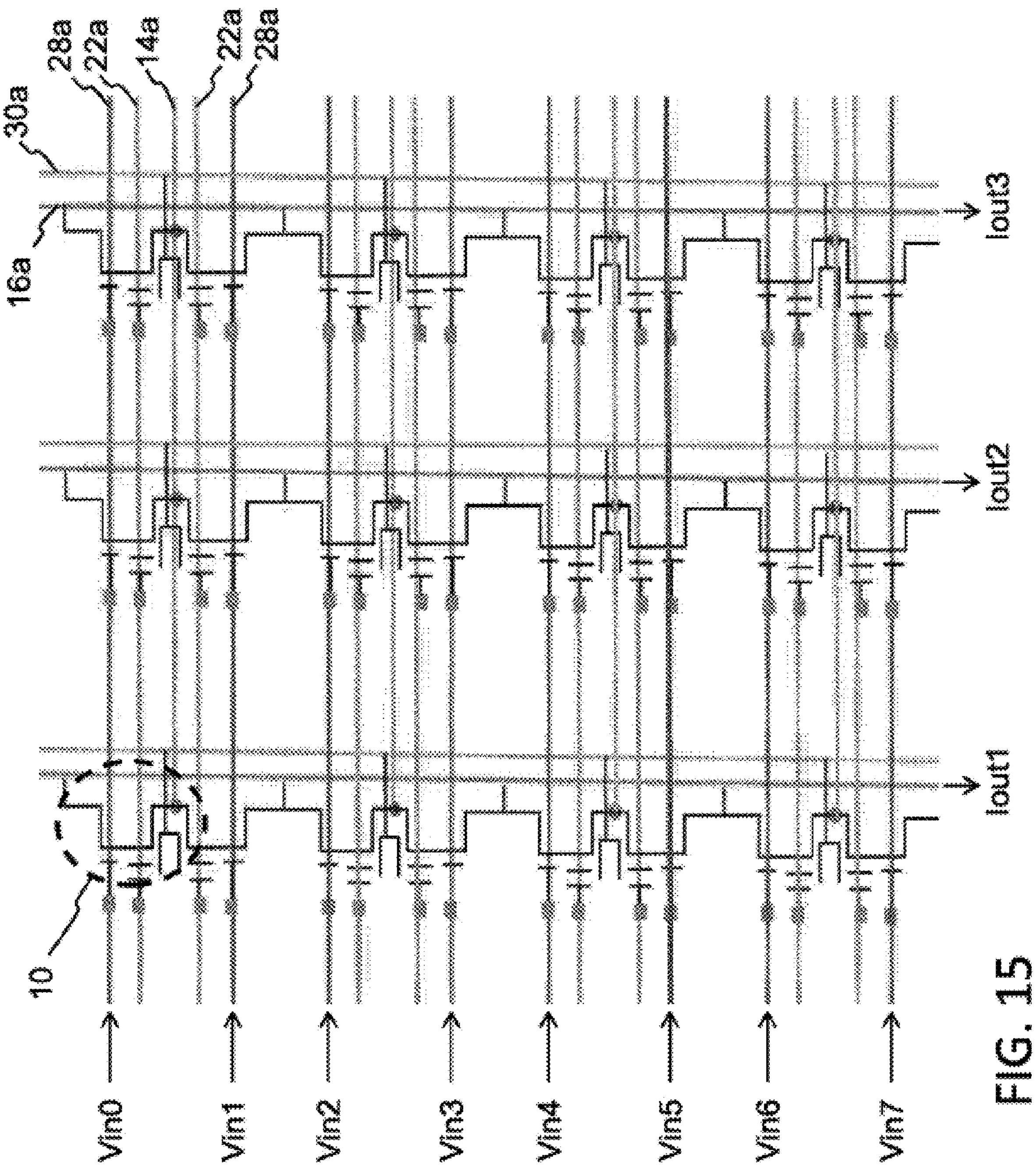
FIGS. 15-16 are schematic diagrams illustrating a first architecture of an array of four-gate memory cells.

FIG. 15 illustrates an array of four-gate memory cells (i.e., such as that shown in FIG. 6) arranged as a drain summing matrix multiplier. The various gate and region lines for the array of FIG. 15 are the same as that in FIG. 7 (with the same element numbers for corresponding structure), except that the erase gate lines 30*a* run vertically instead of horizontally (i.e., each erase gate line 30*a* connects together all the erase gates 30 for that column of memory cells) so that each memory cell 10 can be independently programmed, erased and read. After each of the memory cells is programmed with the appropriate weight value for that cell, the array acts as a drain summing matrix multiplier. The matrix inputs are Vin0 . . . Vin7 and are placed on select gate lines 28*a*. The matrix of outputs Iout0 . . . IoutN for the array of FIG. 15 are produced on the bit lines 16*a*. Each output Iout is a sum of the cell current I times the weight W stored in the cell, for all the cells in the column:

$$Iout=\Sigma(Iij*Wij)$$

Figure 16:
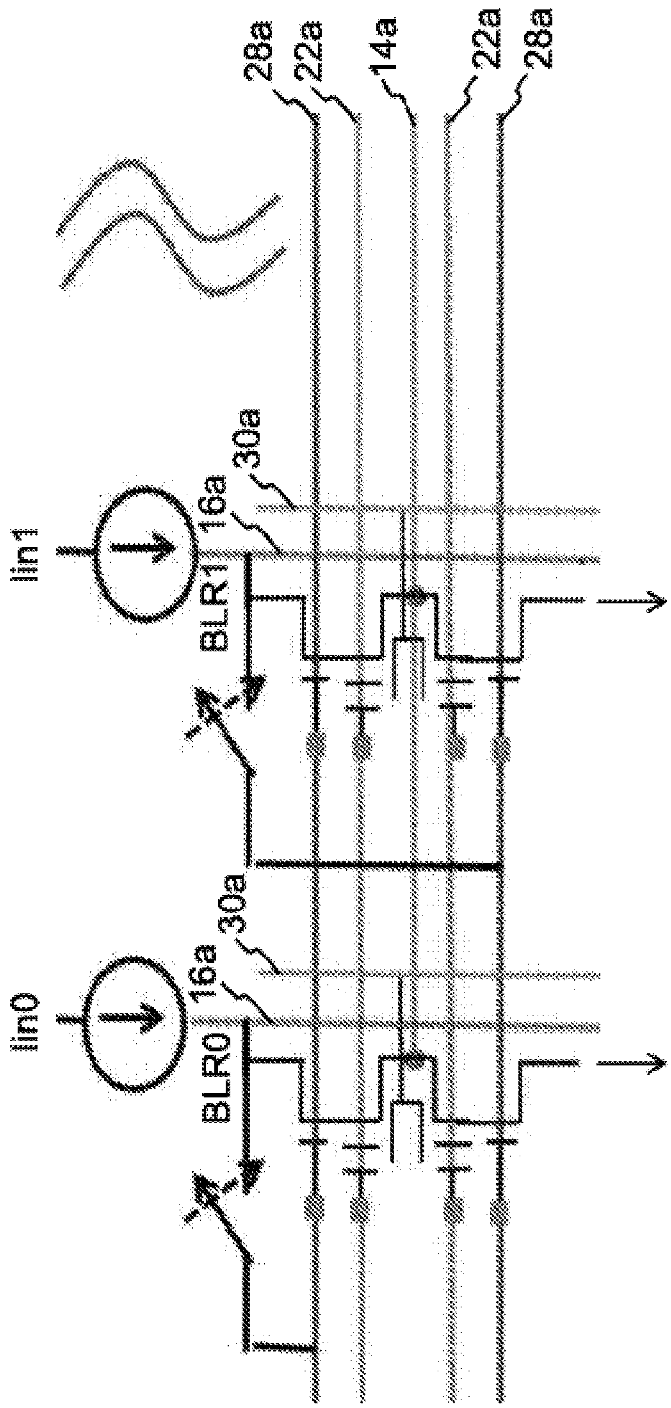

Each memory cell (or pair of memory cells) acts as a single synapse having a weight value expressed as output current Iout dictated by the sum of the weight values stored in the memory cell (or pair of memory cells) in that column. The output of any given synapse is in the form of current. Therefore, each subsequent VMM stage after the first stage preferably includes circuitry for converting incoming currents from the previous VMM stage into voltages to be used as the input voltages Vin. FIG. 16 illustrates an example of such current-to-voltage conversion circuitry, which is a modified row of memory cells that log converts the incoming currents Iin0 . . . IinN into the input voltages Vin0 . . . VinN.

The memory cells described herein are biased in weak inversion, $$Ids=Io*e^{(Vg-Vth)/kVt}=w*Io*e^{(Vg)/kVt}$$

$$w=e^{(-Vth)/kVt}$$

For the I-to-V log converter using a memory cell to convert input current into an input voltage:

$$Vg=k*Vt*\log[Ids/wp*Io]$$

For a memory array used as a vector matrix multiplier VMM, the output current is:

$$Iout=wa*Io*e^{(Vg)/kVt},\text{ namely}$$

$$Iout=(wa/wp)*Iin=W*Iin$$

$$W=e^{(Vthp-Vtha)/kVt}$$

Figure 17:
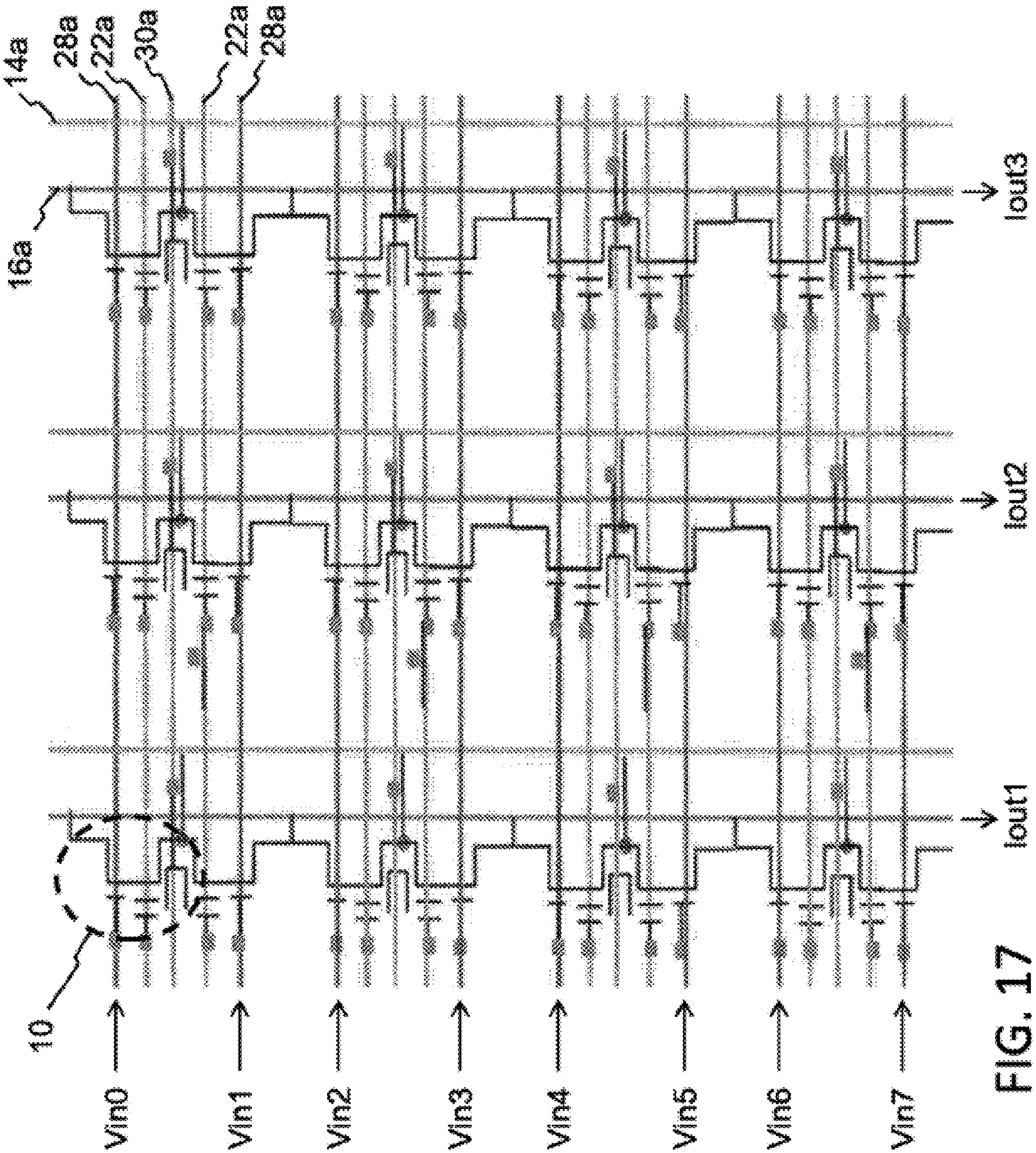
FIGS. 17-18 are schematic diagrams illustrating a second architecture of an array of four-gate memory cells.
Figure 18:
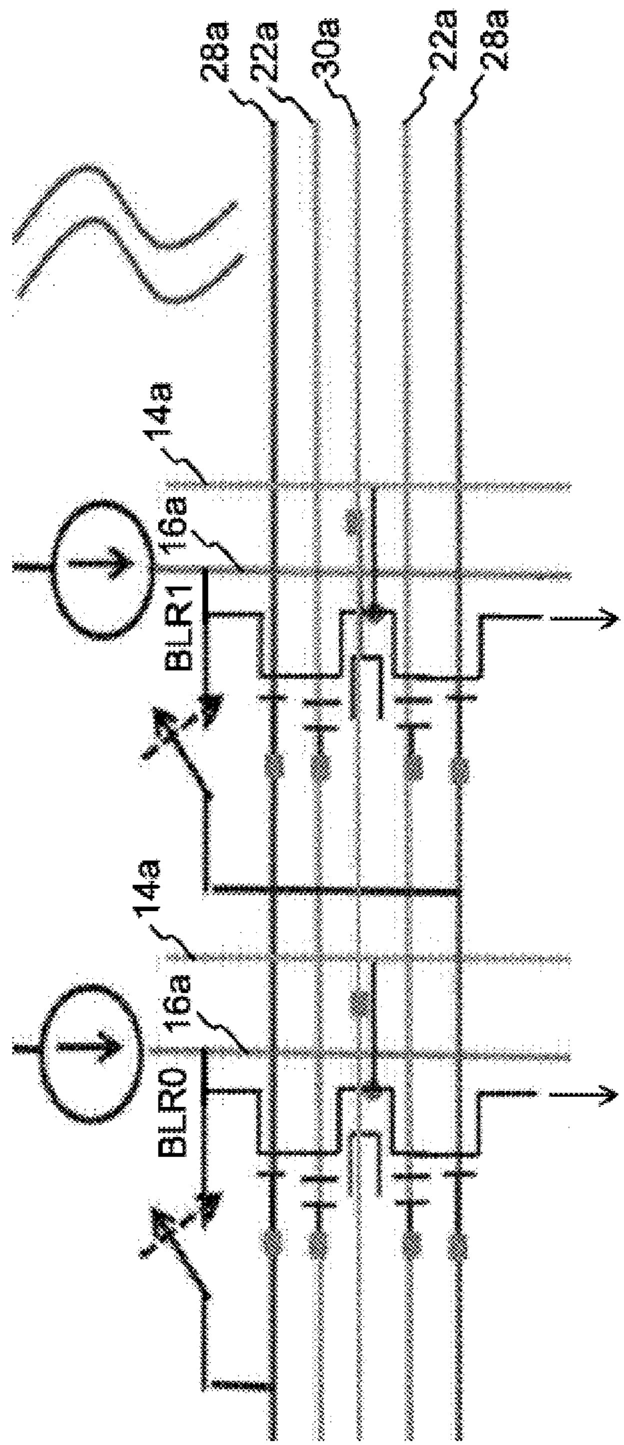

FIGS. 17 and 18 illustrate another configuration of an array of four-gate memory cells (i.e., such as that shown in FIG. 6) arranged as a drain summing matrix multiplier. The lines for the array of FIGS. 17 and 18 are the same as that in the array of FIGS. 15 and 16, except that the source lines 14*a* run vertically instead of horizontally (i.e., each source line 14*a* connects together all the source regions 14 for that column of memory cells) and erase gate lines 30*a* run horizontally instead of vertically (i.e., each erase gate line 30*a* connects together all the erase gates 30 for that row of memory cell pairs), so that each memory cell can be independently programmed, erased and read. The matrix inputs Vin0 . . . VinN remain on select gate lines 28*a*, and the matrix outputs Iout0 . . . IoutN remain on the bit lines 16*a*.

Figure 19:
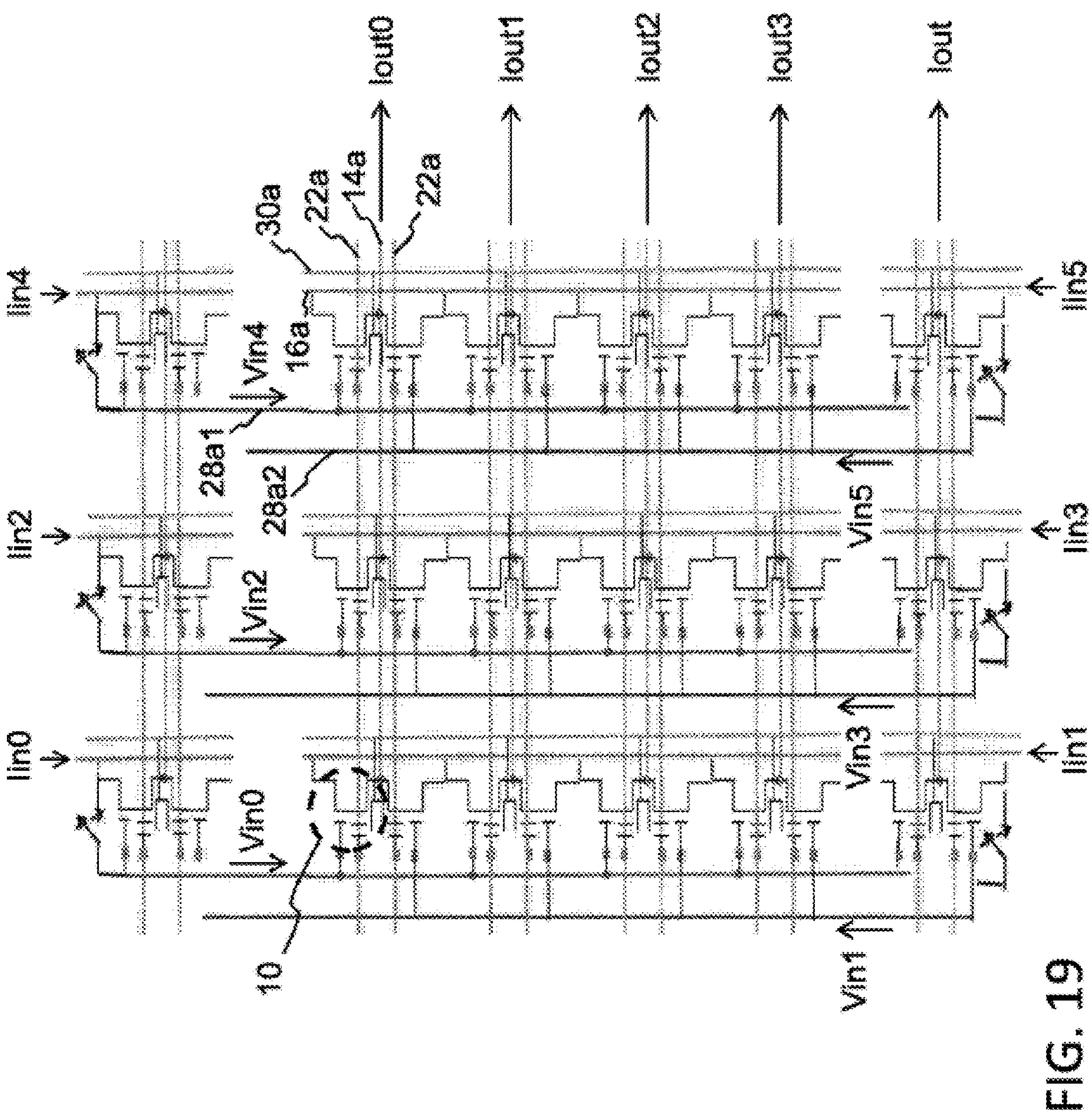
FIG. 19 is a schematic diagram illustrating a third architecture of an array of four-gate memory cells.

FIG. 19 illustrates another configuration of an array of four-gate memory cells (i.e., such as that shown in FIG. 6) arranged as a gate coupling/source summing matrix multiplier. The lines for the array of FIG. 19 are the same as that in FIGS. 15 and 16, except that the select gate lines 28*a* run vertically and there are two of them for each column of memory cells. Specifically, each column of memory cells include two select gate lines: a first select gate line 28a1 connecting together all the select gates 28 of the odd row memory cells, and a second select gate line 28a2 connecting together all the select gates 28 of the even row memory cells.

The circuits at the top and bottom of FIG. 19 serve to log convert the input currents Iin0 . . . IinN into the input voltages Vin0 . . . VinN. The matrix inputs shown in this figure are Vin0 . . . Vin5 and are placed on the select gate lines 28a1 and 28a2. Specifically, input Vin0 is placed on the select line 28a1 for the odd cells in column 1. Vin1 is placed on the select gate line 28a2 for the even cells in column 1. Vin2 is placed on the select gate line 28a1 for the odd cells in column 2. Vin3 is placed on the select gate line 28a2 for the even cells in column 2, and so on. The matrix outputs Iout0 . . . Iout3 are provided on the source lines 14a. The bit lines 16a are biased at fixed bias voltage VBLrd. Each output Iout is a sum of the cell current I times the weight W stored in the cell, for all the cells in that row of memory cells. Therefore, for this architecture, each row of memory cells acts as a single synapse having a weight value expressed as output current Iout dictated by the sum of the weight values stored in the memory cells in that row.

Figure 20:
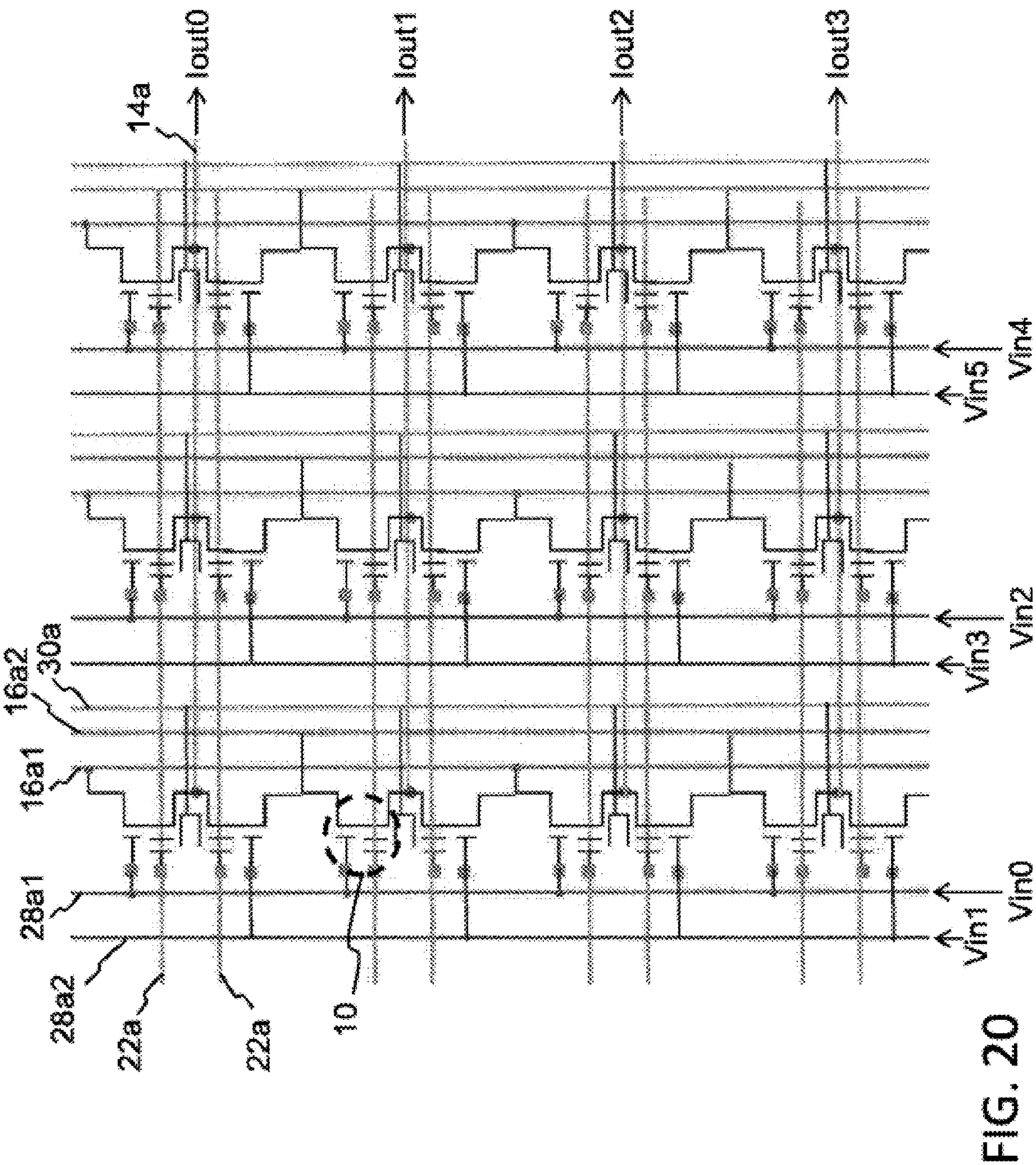
FIG. 20 is a schematic diagram illustrating a fourth architecture of an array of four-gate memory cells.

FIG. 20 illustrates another configuration of an array of four-gate memory cells (i.e., such as that shown in FIG. 6) arranged as a gate coupling/source summing matrix multiplier. The lines for the array of FIG. 20 are the same as that in FIG. 19, except that bit lines 16 run vertically and there are two of them for each column of memory cells. Specifically, each column of memory cells include two bit lines: a first bit line 16a1 connecting together all the drain regions of the adjacent twin memory cells (two memory cells sharing the same bit line contact), and a second bit line 16a2 connecting together all the drain regions of the next adjacent twin memory cells. The matrix inputs Vin0 . . . VinN remain on select gate lines 28a1 and 28a2, and the matrix outputs Iout0 . . . IoutN remain on the source lines 14a. The set of all the first bit lines 16a1 are biased at a bias level, e.g., 1.2v, and the set of all the second bit lines 16a2 are biased at another bias level, e.g., 0 v. The source lines 14a are biased at a virtual bias level, e.g., 0.6v. For each pair of memory cells sharing a common source line 14a, the output current will be a differential output of the top cell minus the bottom cell. Therefore, each output Iout is a sum of these differential outputs:

$$Iout=\Sigma(Iiju*Wiju-Iijd*Wijd)$$

$$SL\ \text{voltage}\sim\tfrac{1}{2}Vdd,\sim 0.6\ \text{v}$$

Therefore, for this architecture, each row of paired memory cells acts as a single synapse having a weight value expressed as output current Iout which is the sum of differential outputs dictated by the weight values stored in the memory cells in that row of paired memory cells (e.g., one positive weight and one negative weight).

Figure 21:
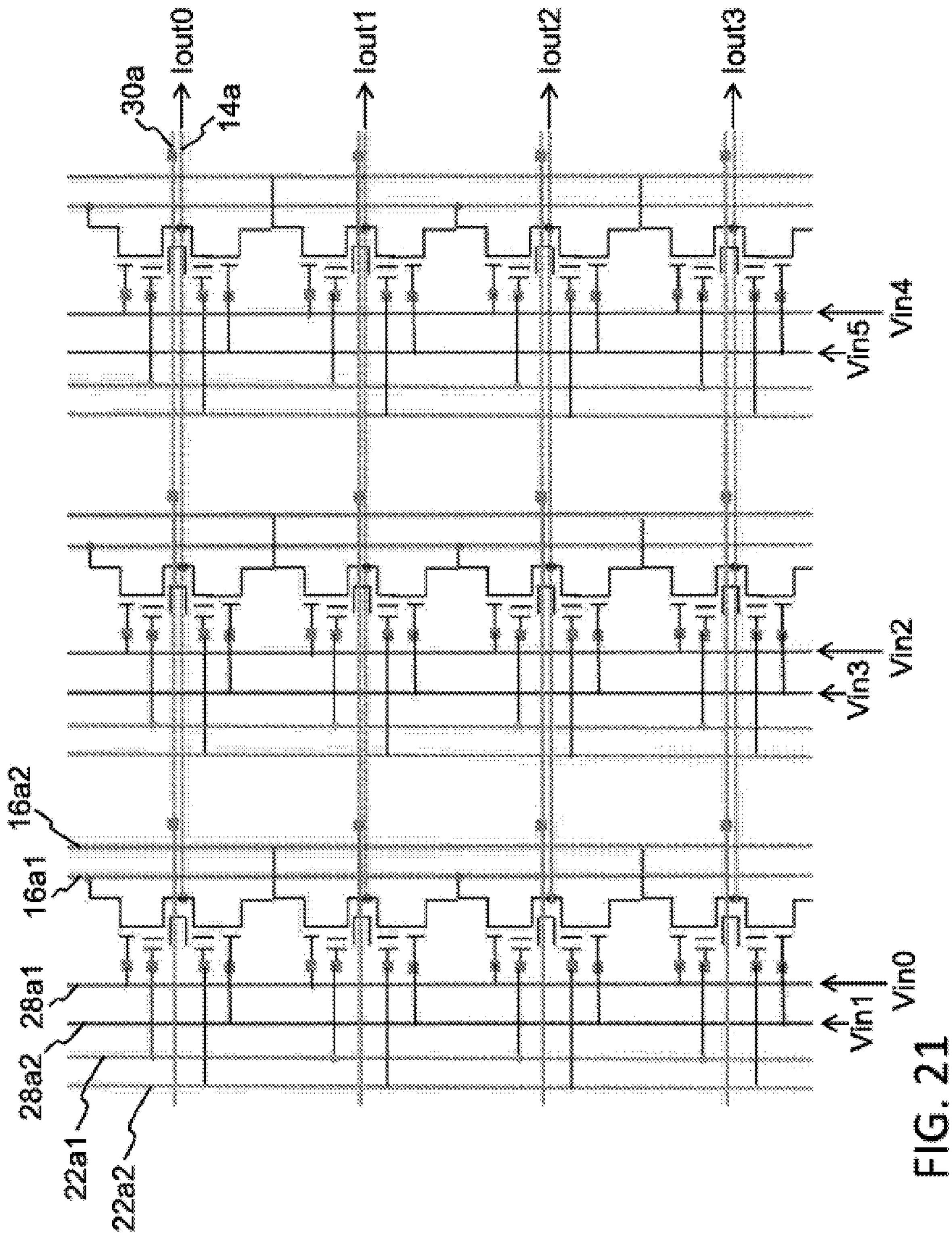
FIG. 21 is a schematic diagram illustrating a fifth architecture of an array of four-gate memory cells.

FIG. 21 illustrates another configuration of an array of four-gate memory cells (i.e., such as that shown in FIG. 6) arranged as a gate coupling/source summing matrix multiplier. The lines for the array of FIG. 21 are the same as that in FIG. 20, except that the erase gates 30a run horizontally, and the control gate lines 22a run vertically and there are two of them for each column of memory cells. Specifically, each column of memory cells include two control gate lines: a first control gate line 22a1 connecting together all the control gates 22a of the odd row memory cells, and a second control gate line 22a2 connecting together all the control gates 22a of the even row memory cells. The matrix inputs Vin0 . . . VinN remain on select gate lines 28a1 and 28a2, and the matrix outputs Iout0 . . . IoutN remain on the source lines 14a.

Figure 22:
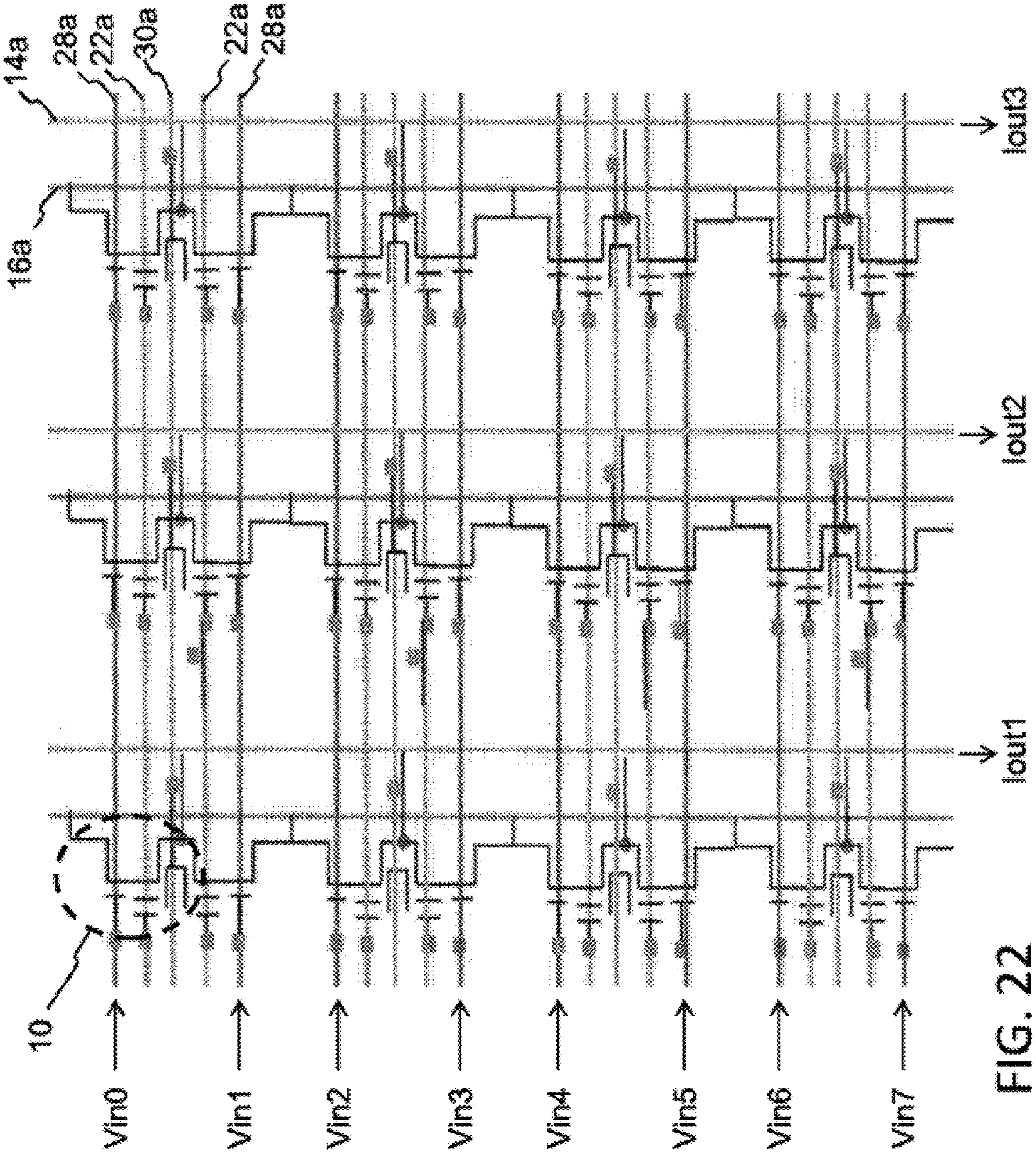
FIG. 22 is a schematic diagram illustrating a sixth architecture of an array of four-gate memory cells.

FIG. 22 illustrates another configuration of an array of four-gate memory cells (i.e., such as that shown in FIG. 6) arranged as a source summing matrix multiplier. The lines and inputs for the array of FIG. 22 are the same as that in FIG. 17. However, instead of the outputs being provided on the bit lines 16a, they are provided on the source lines 14a. The matrix inputs Vin0 . . . VinN remain on select gate lines 28a.

Figure 1:
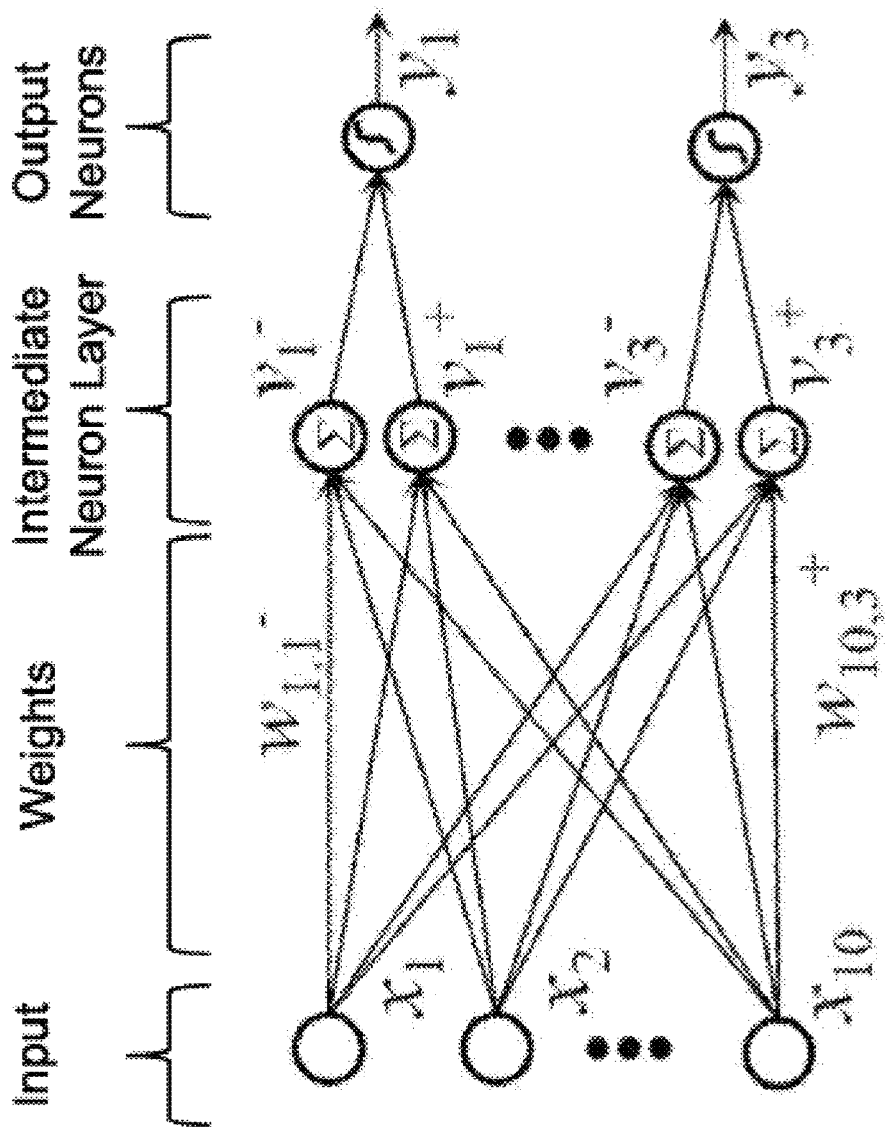
FIG. 1 is a diagram that illustrates an artificial neural network.
Figure 23:
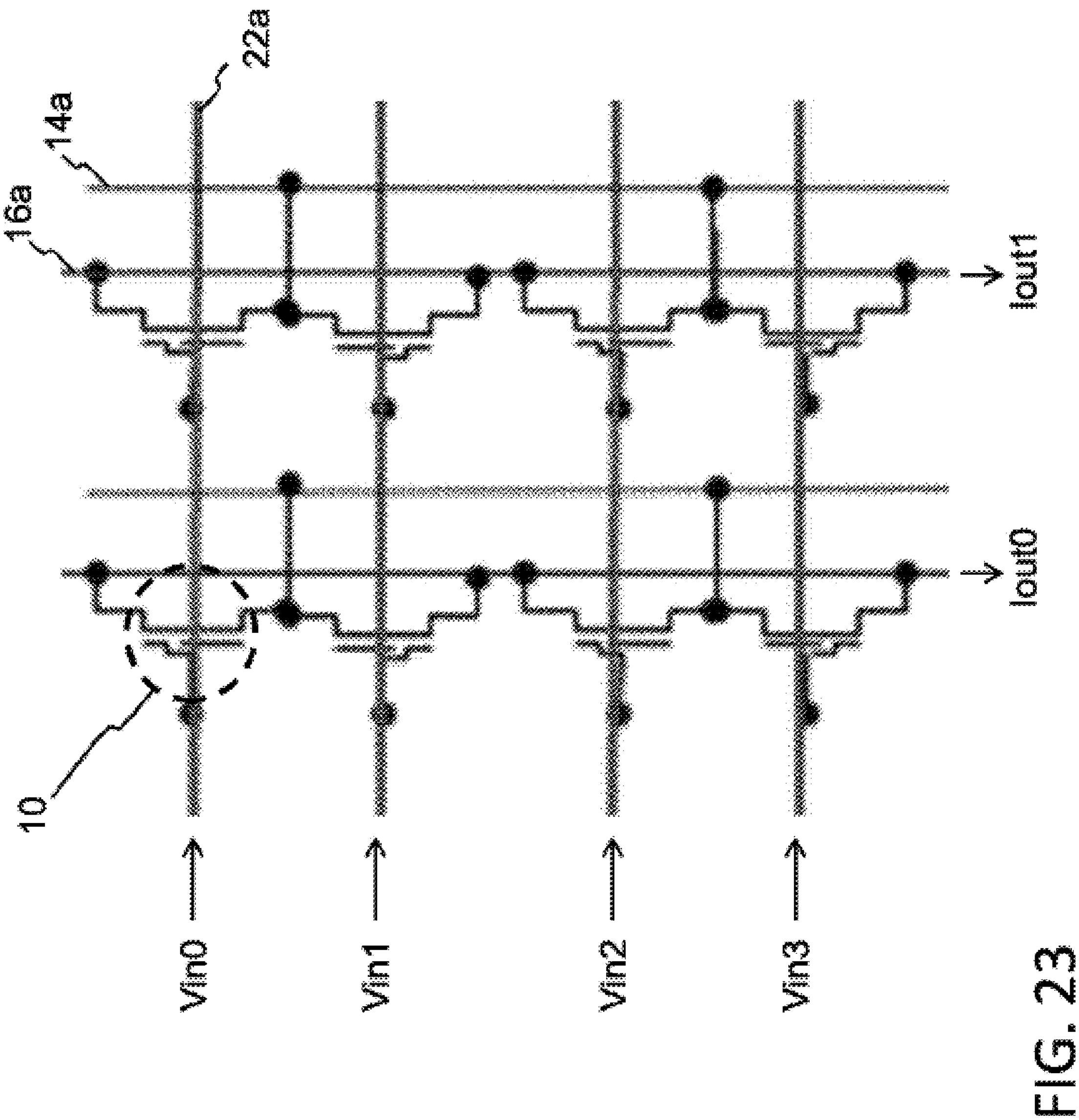
FIG. 23 is a schematic diagram illustrating a first architecture of an array of two-gate memory cells.

FIG. 23 illustrates a configuration of an array of two-gate memory cells (i.e., such as that shown in FIG. 1) arranged as a drain summing matrix multiplier. The lines for the array of FIG. 23 are the same as that in FIG. 5, except that the horizontal source lines 14a have been replaced with vertical source lines 14a. Specifically, each source line 14a is connected to all the source regions in that column of memory cells. The matrix inputs Vin0 . . . VinN are placed on the control gate lines 22a. The matrix outputs Iout0 . . . IoutN are produced on the bit lines 16a. Each output Iout is a sum of the cell current I times the weight W stored in the cell, for all the cells in the column. Each column of memory cells acts as a single synapse having a weight value expressed as output current Iout dictated by the sum of the weight values stored in the memory cells for that column.

Figure 24:
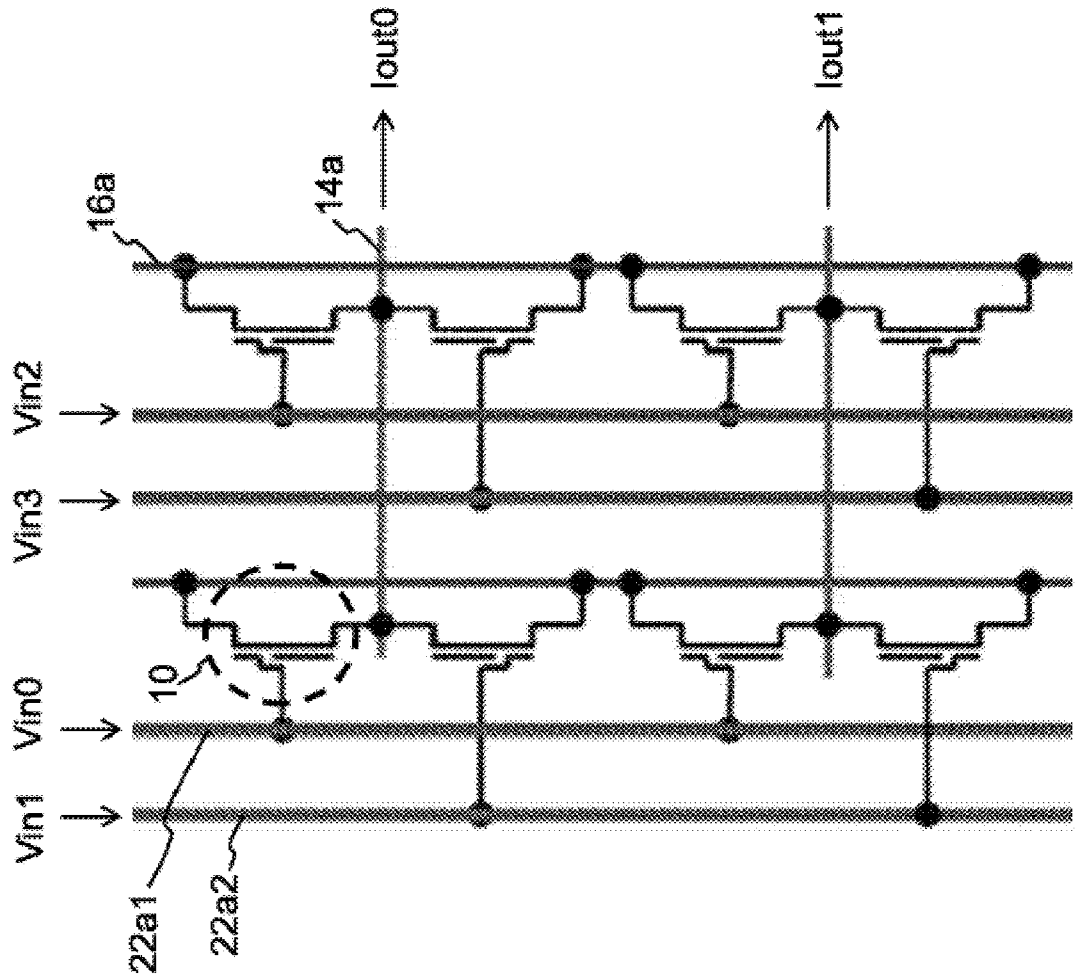
FIG. 24 is a schematic diagram illustrating a second architecture of an array of two-gate memory cells.

FIG. 24 illustrates a configuration of an array of two-gate memory cells (i.e., such as that shown in FIG. 1) arranged as a source summing matrix multiplier. The lines for the array of FIG. 24 are the same as that in FIG. 5, except that the control gate lines 22a run vertically and there are two of them for each column of memory cells. Specifically, each column of memory cells include two control gate lines: a first control gate line 22a1 connecting together all the control gates 22a of the odd row memory cells, and a second control gate line 22a2 connecting together all the control gates 22a of the even row memory cells.

The matrix inputs for this configuration are Vin0 . . . VinN and are placed on the control gate lines 22a1 and 22a2. Specifically, input Vin0 is placed on control gate line 22a1 for the odd row cells in column 1. Vin1 is placed on the control gate line 22a2 for the even row cells in column 1. Vin2 is placed on the control gate line 22a1 for the odd row cells in column 2. Vin3 is placed on the control gate line 22a2 for the even row cells in column 2, and so on. The matrix outputs Iout0 . . . IoutN are produced on the source lines 14a. For each pair of memory cells sharing a common source line 14a, the output current will be a differential output of the top cell minus the bottom cell. Therefore, for this architecture, each row of paired memory cells acts as a single synapse having a weight value expressed as output current Iout which is the sum of differential outputs dictated by the weight values stored in the memory cells in that row of paired memory cells.

Exemplary operational voltages for the embodiments of FIGS. 15-16, 19 and 20 include:

| | EG | | WL | | CG | | BL | | SL | |
|---|---|---|---|---|---|---|---|---|---|---|
| | sel | unsel | sel | unsel | sel | unsel | sel | unsel | sel | unsel |
| Erase | VEGerase | gnd | gnd | gnd | gnd | VCGerinhibit | gnd | gnd | gnd | gnd |
| Program | VEGprg/ gnd | gnd | VWLprg | gnd | VCGprg | gnd | Iprog | VBLprginh | VSprg | gnd |
| Read | gnd | gnd | VWLrd | gnd | VCGrd | gnd | VBLrd | gnd | VSrd | float/ gnd |

Approximate numerical values include:

| | |
|---|---|
| VEGerase | 8-11.5 v |
| VCGerinhibit | 3.5-8 v |
| VEGprg | 4-6 v |
| VWLprg | 0.8-1.2 v |
| VCGprg | 6-10 v |
| VBLprginh | 1-2.5 v |
| Iprog | 0.2-1 μa |
| VSprg | 3-5 V |
| VWLrd | 0.4-2.0 V |
| VCGrd | 0-2.5 V |
| VBLrd | 1-2 V |
| VSrd | 0-0.6 V |

Exemplary operational voltages for the embodiments of FIGS. 17-18 and 22 include:

| | EG | | WL | | CG | | | BL | | SL | |
|---|---|---|---|---|---|---|---|---|---|---|---|
| | | | | | | unsel - | | | | | |
| | sel | unsel | sel | unsel | sel | shared EG | unsel | sel | unsel | sel | unsel |
| Erase | VEGerase | gnd | gnd | gnd | gnd | VCGerinh | gnd | gnd | VBLerinh/ gnd | VSLerinh | gnd |
| Program | VEGprg/ gnd | gnd | VWLprg | gnd | VCGprg/ gnd | gnd | gnd | Iprog | VBLprginh | VSprg | gnd |
| Read | gnd | gnd | VWLrd | gnd | VCGrd | gnd | gnd | VBLrd | gnd | VSrd | float/gnd |

Approximate numerical values include:

| | |
|---|---|
| VEGerase | 7-10 v |
| VSLerinh | 3.5-6 v |
| VCGerinh | 3.5-7 v |
| VBLerinh | 1-2.5 v |
| VEGprg | 4-6 v |
| VWLprg | 0.8-1.2 v |
| VCGprg | 6-10 v |
| VBLprginh | 1-2.5 v |
| Iprog | 0.2-1 μa |
| VSprg | 3-5 V |
| VWLrd | 0.4-2.0 V |
| VCGrd | 1-2.5 V |
| VBLrd | 1-2 V |
| VSrd | 0-0.6 V |

Figure 25:
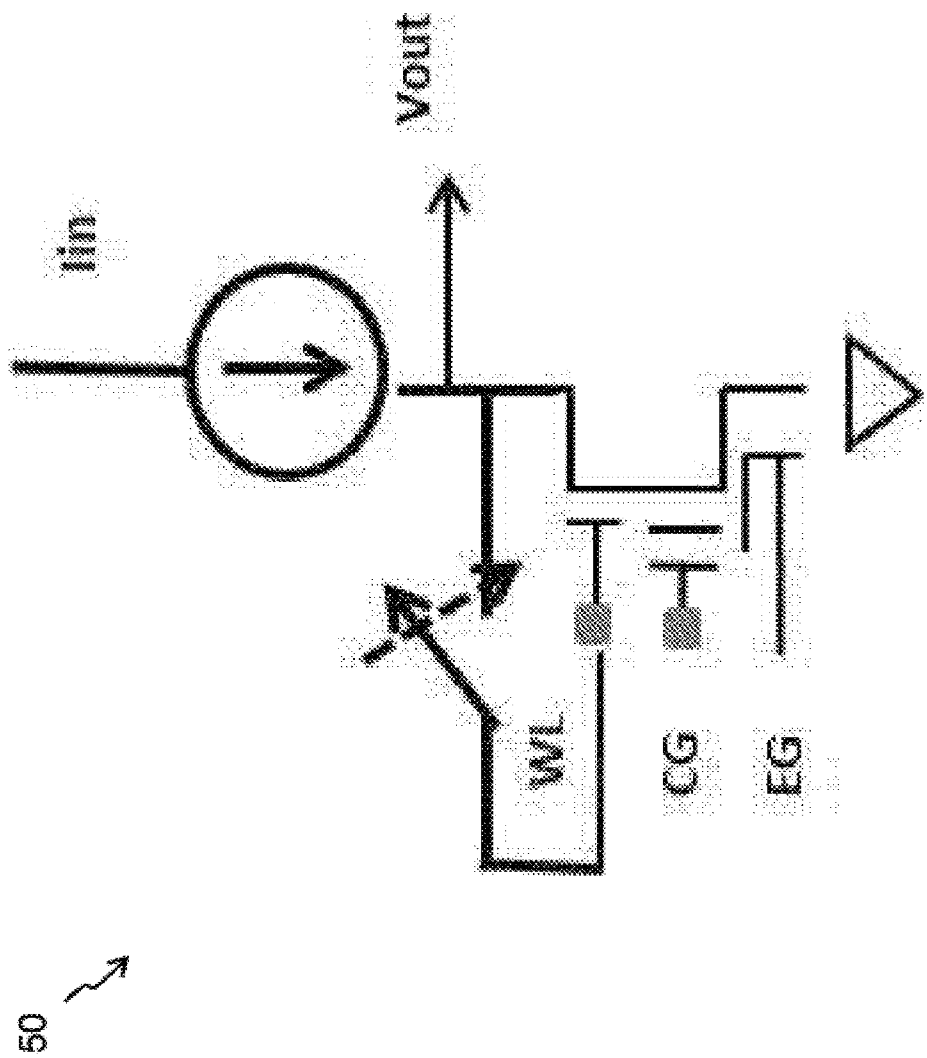
FIG. 25 is a diagram illustrating a current-to-voltage log converter.
Figure 26:
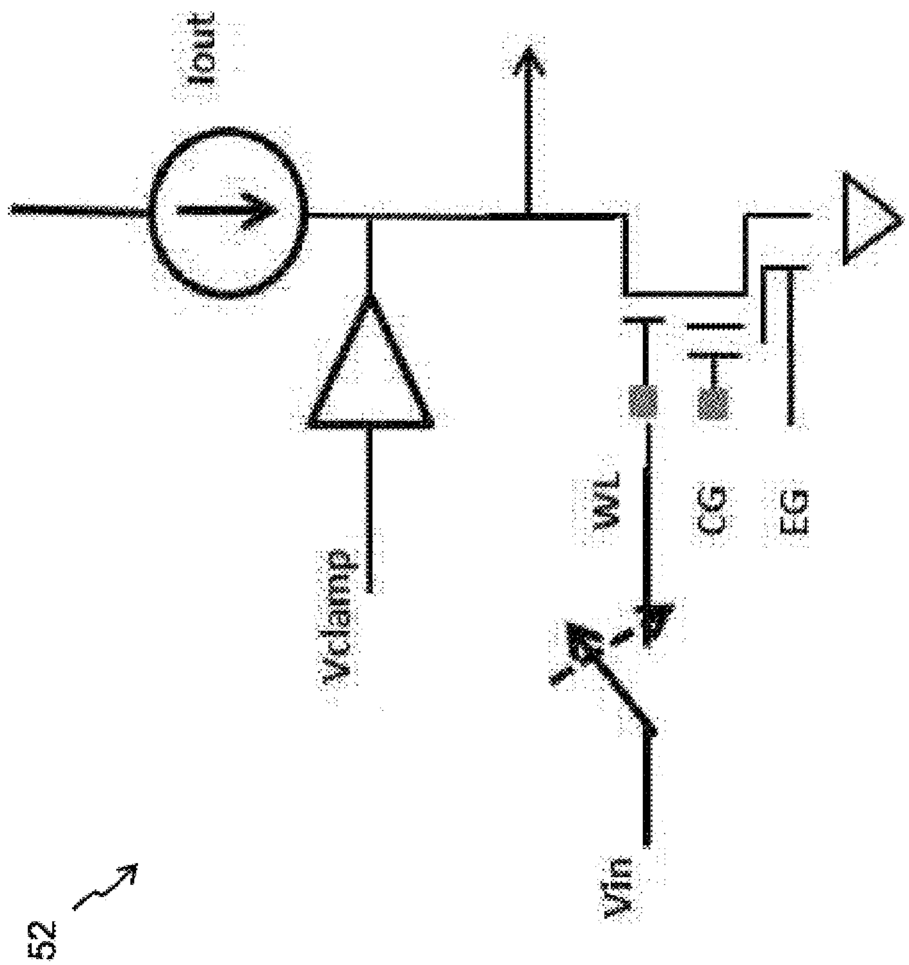
FIG. 26 is a diagram illustrating a voltage-to-current log converter.
Figure 27:
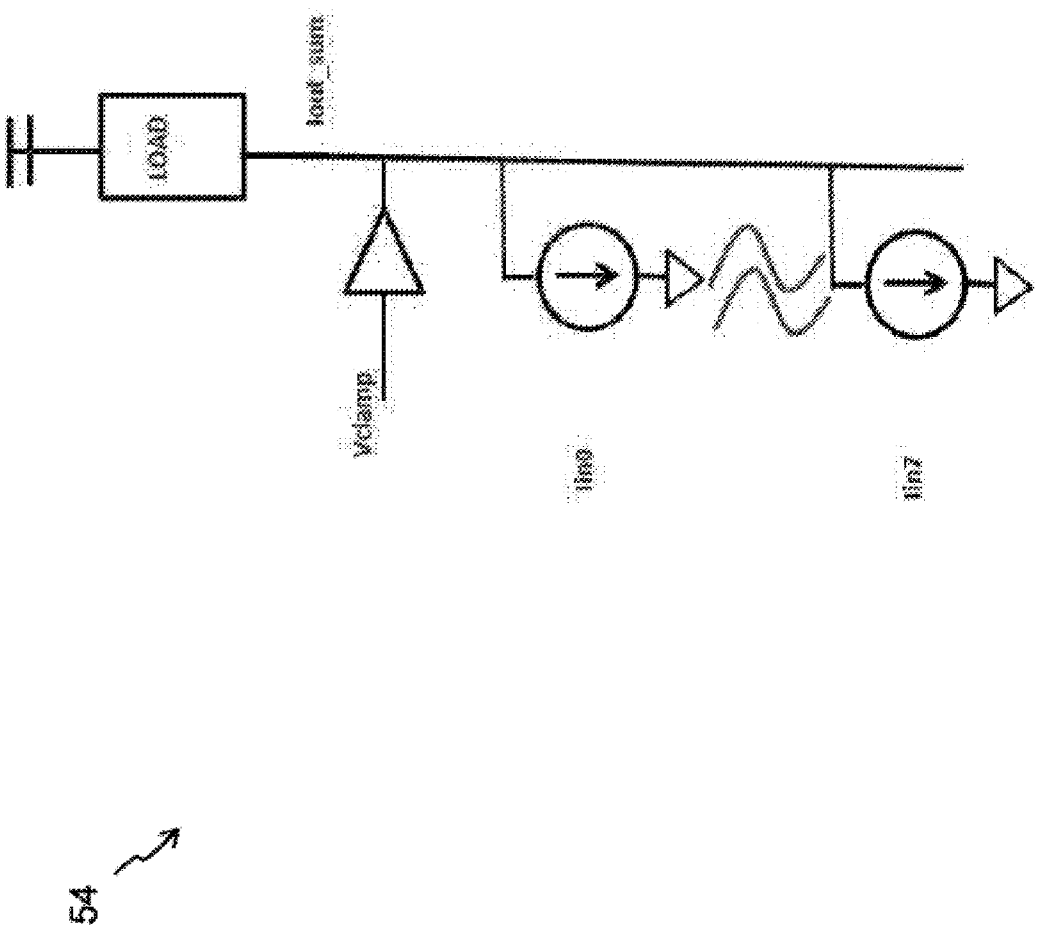
FIG. 27 is a diagram illustrating a Gnd-referred current summer.
Figure 28:
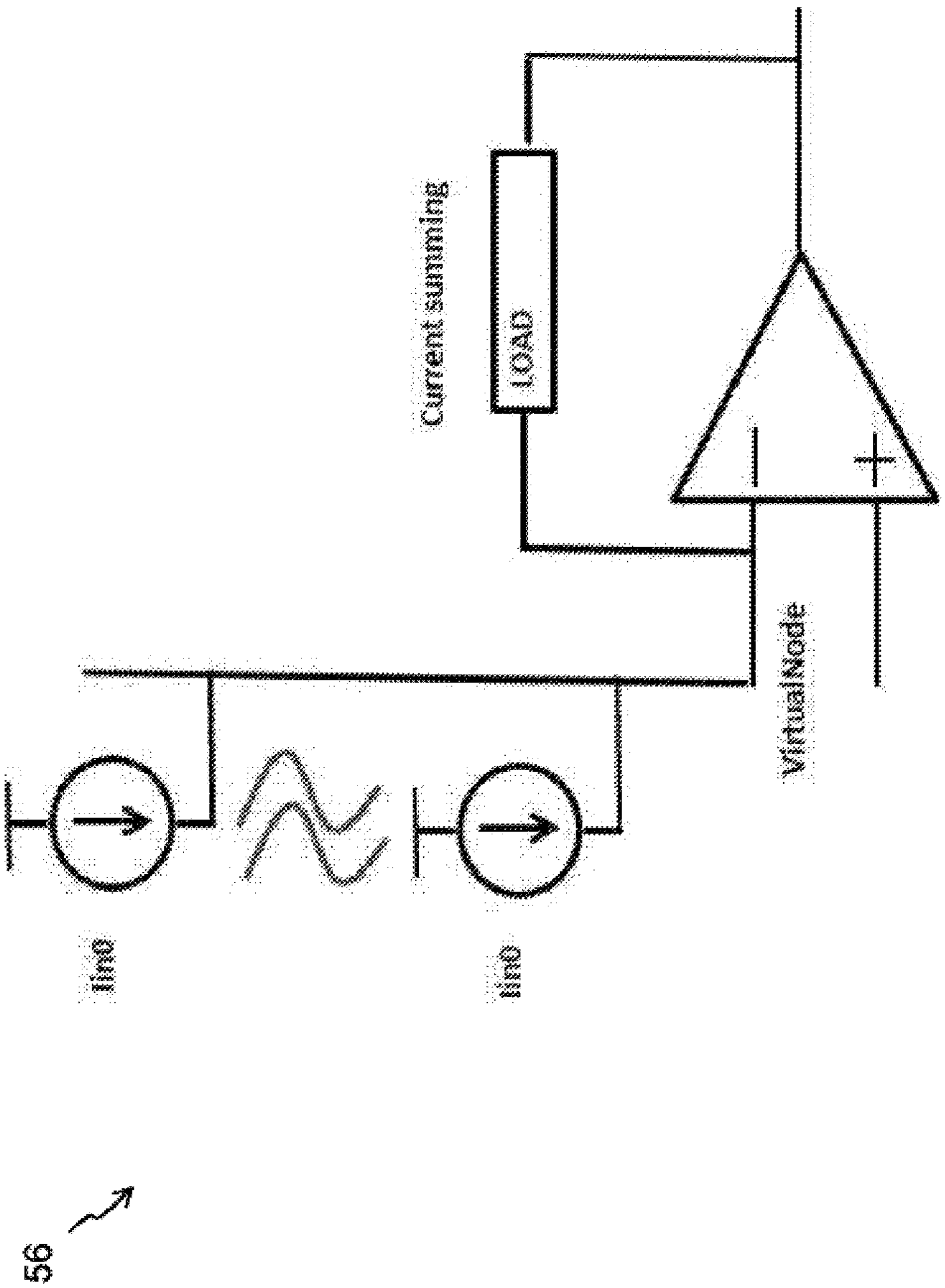
FIG. 28 is a diagram illustrating a Vdd-referred current summer.

FIG. 25 illustrates an exemplary current to voltage log converter 50 for use with the present invention (WL=select gate line, CG=control gate line, EG=erase gate line). The memory is biased in a weak inversion region, Ids=Io*$e^{(Vg-Vth)/kVt}$ FIG. 26 illustrates an exemplary voltage to current log converter 52 for use with the present invention. The memory is biased in a weak inversion region. FIG. 27 illustrates a Gnd-referred current summer 54 for use with the present invention. FIG. 28 below illustrates a Vdd-referred current summer 56 for use with the present invention. Examples of the load include a diode, a non-volatile memory cell, and a resistor.

The above described memory array configurations implement a feed-forward classification-engine. The training is completed by storing "weight" values in the memory cells (creating a synapse array), which means subthreshold-slope-factors of the individual cells have been modified. The neurons are implemented by summing the outputs of synapse and firing or not firing depending on the neuron threshold (i.e., making a decision).

The following steps can be used to process input current $I_E$ (e.g. the input current is coming directly from the output of feature calculations for image recognition):

Step 1—Convert to log scale for easier processing with non-volatile memory.

Input Current to voltage conversion using a bipolar transistor. Bias voltage $V_{BE}$ of a bipolar transistor has a logarithmic relationship with the emitter current.

$$VBE=a*\ln I_E-b \rightarrow V_{BE} \propto \ln I_E$$

Where a (ratio) and b (bias or offset) are constants $V_{BE}$ voltage is generated such that the memory cells will be operated in the subthreshold region.

Step 2—Apply the generated bias voltage VBE to the word line (in subthreshold region).

Output current $I_{DRAIN}$ of a CMOS transistor has an exponential relationship with the input voltage ($V_{GS}$), Thermal Voltage ($U_T$) and kappa ($k=C_{ox}/(C_{ox}+C_{dep})$), where $C_{ox}$, and $C_{dep}$ are linearly dependent on the charge on the floating gate.

$I_{DRAIN} \propto (\mathrm{Exp}(kV_{BE}/U_T)$, OR $\ln I_{DRAIN} \propto kV_{BE}/U_T$ Logarithmic of $I_{DRAIN}$ has a linear relationship with the multiple of $V_{BE}$ and charge on the floating gate (related to kappa), where $U_T$ is constant at a given temperature.

An Output=Input*weights relationship exists for a synapse.

The output of each of the cells ($I_{DRAIN}$) could be tied together in the read mode to sum up the values of each synapse in the array or sector of the array. Once $I_{DRAIN}$ has been summed up, it can be fed into a current comparator, and output a "logic" 0 or 1 depending on the comparison for a single perception neural network. One perception (one sector) is described above. The output from each perception can be fed to the next set of sectors for multiple perceptions.

Figure 29:
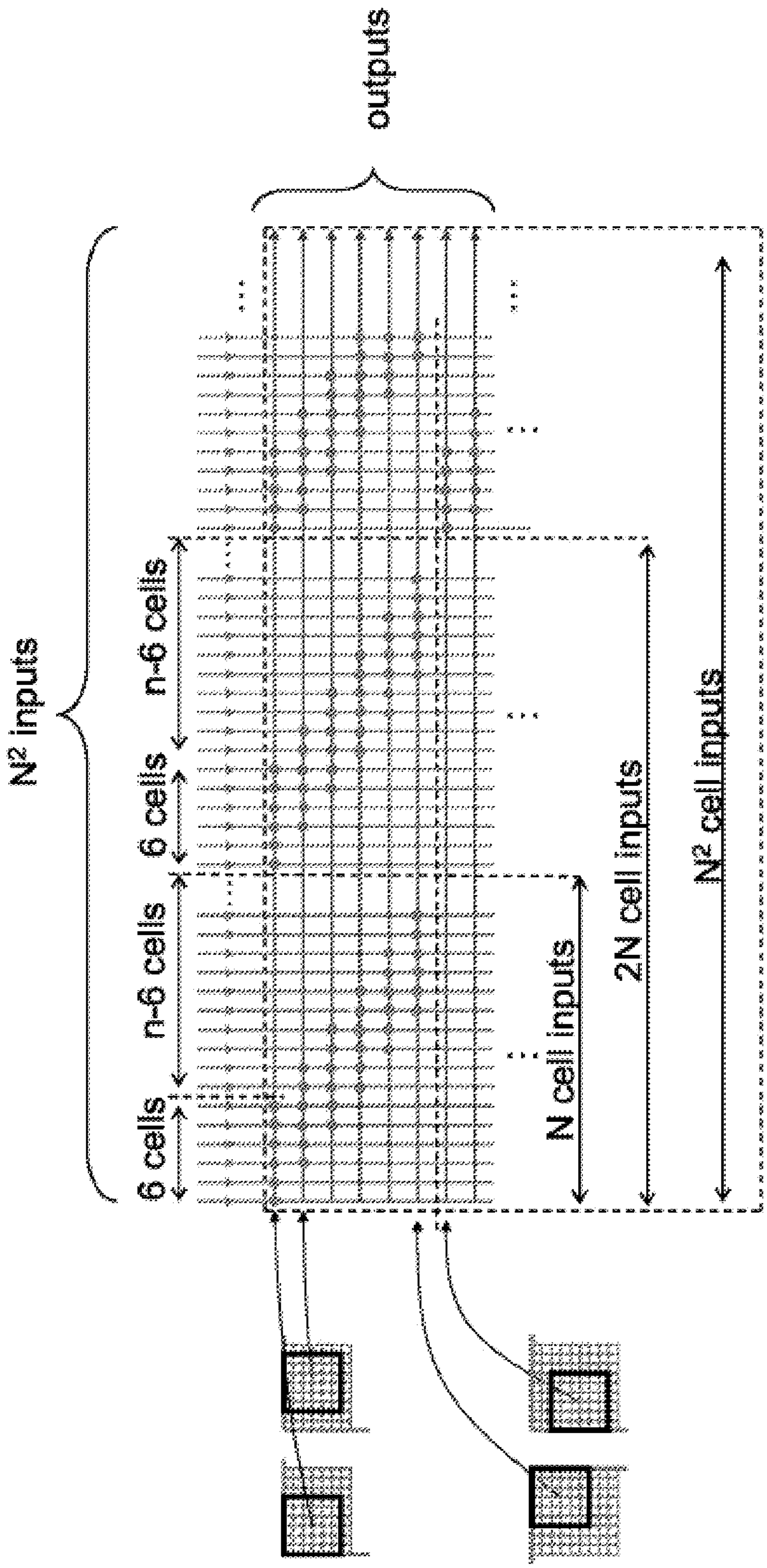
FIG. 29 is a diagram illustrating the utilization of $N^2$ neural net inputs of a non-volatile memory array.

In a memory based Convolutional Neural Network, a set of inputs needs to be multiplied with certain weights to produce a desired result for a hidden layer or output layer. As explained above, one technique is to scan the preceding image (for example an N×N matrix using an M×M filter (kernel) that is shifted by X pixels across the image in both horizontal and vertical directions. The scanning of the pixels can be done at least partially concurrently so long as there are enough inputs to the memory array. For example, as shown in FIG. 29, a filter size of M=6 (i.e., a 6×6 array of 36 pixels) can be used to scan an N×N image array, using shifts of X=2. In that example, the first row of six pixels in the filter is provided to the first 6 of the inputs to the memory array of $N^2$ inputs. Then, the second row of six pixels in the filter is provided to the first 6 of the inputs in the second N inputs of the $N^2$ inputs, and so on. This is represented in the first row of the diagram in FIG. 29, where the dots represent the weights stored in the memory array for multiplication by the inputs as set forth above. Then, the filter is shifted to the right by two pixels, and the first row of six pixels in the shifted filter is provided to the third through the eighth inputs of the first N inputs, the second row of six pixels is provided to the third through the eight inputs of the second N inputs, and so on. Once the filter is shifted all the way to the right side of the image, the filter is repositioned back to the left side, but shifted down by two pixels, where the process repeats again, until the entire N×N image is scanned. Each set of horizontally shifted scans can be represented by trapezoidal shapes showing which of the $N^2$ memory array inputs are provided with data for multiplication.

Figure 30:
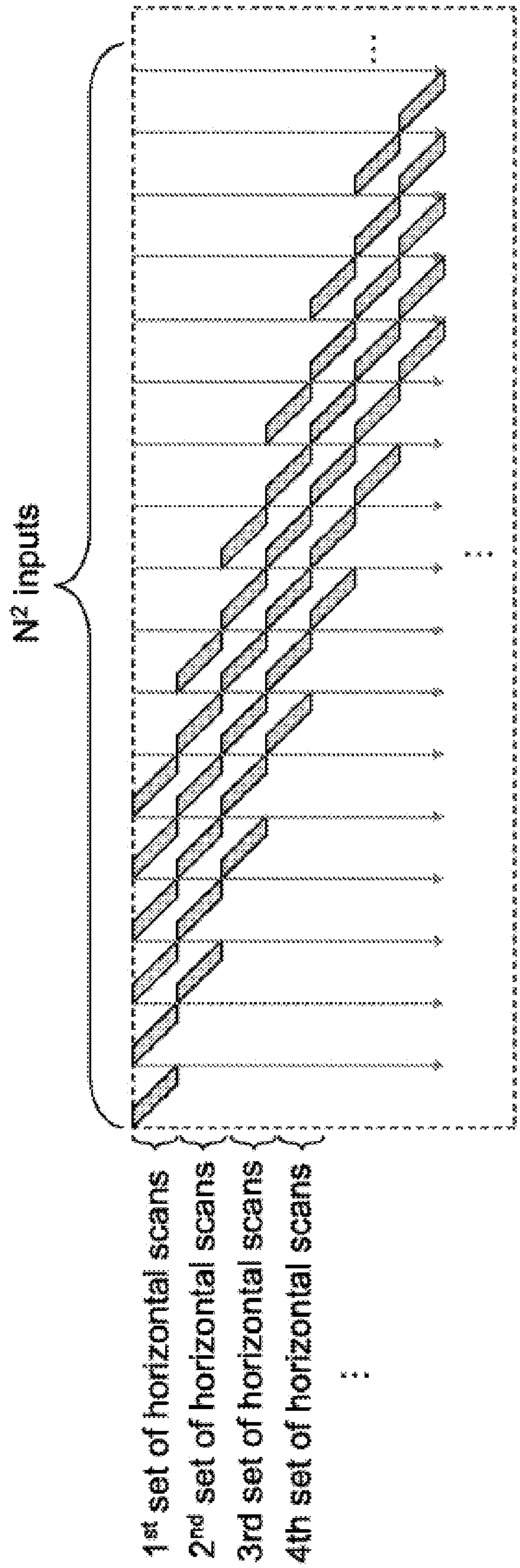
FIG. 30 is a diagram illustrating the utilization of $N^2$ neural net inputs of a non-volatile memory array.

Accordingly, a scan of N×N image array, using a shift of two pixels between scans, and a filter size of 6×6, requires $N^2$ inputs and $((N-4)/2))^2$ rows. FIG. 30 graphically shows the trapezoidal shapes indicating how the weights in the memory array are stored for the filter scan. Each row of shaded areas represents weights being applied to the inputs during one set of the horizontal scans. The arrows indicate linear input lines of the memory array (e.g., the input lines 28*a* in FIG. 15 that receive the input data extend all the way across the memory array in a linear manner, each one always accessing the same row of memory cells; in the case of the array of FIG. 19, each of the input lines always access the same column of memory cells). The white areas indicate where no data is being supplied to the inputs. Therefore, the white areas are indicative of inefficient use of the memory cell array.

Figure 31:
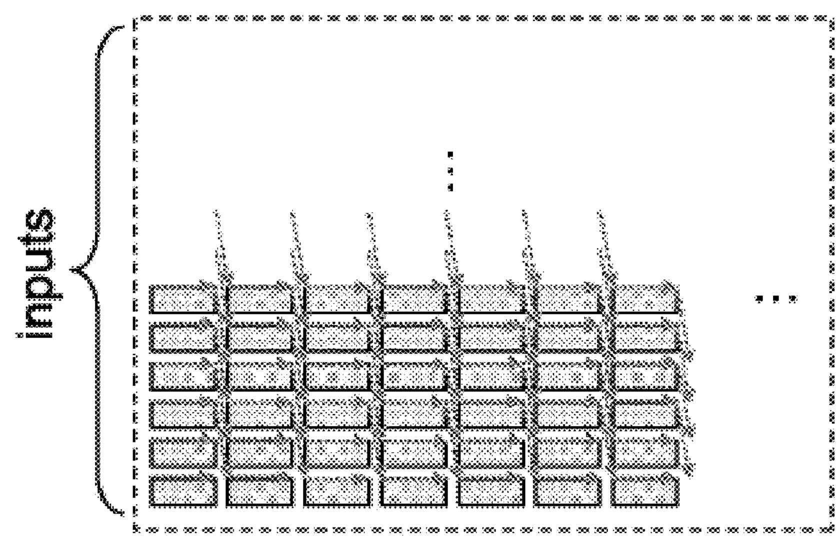
FIG. 31 is a diagram illustrating the utilization of neural net inputs of a non-volatile memory array having periodically shifting input lines.

Efficiency can be increased, and the total number of inputs reduced, by reconfiguring the memory arrays as shown in FIG. 31. Specifically, the input lines of the memory array are shifted periodically to another row or column, thus reducing the unused portions of the array, and therefore reducing the number of repeated input lines over the array needed to perform the scan. Specifically, in the case of the present example where the shift X=2, the arrows indicate that each input line periodically shifts over by two rows or two columns, transforming the widely spaced apart memory cell utilization trapezoidal shapes to closely spaced memory cell utilization rectangular shapes. While extra space between memory cell portions are needed for wire bundles to implement this shift, the number of inputs needed in the memory cell array is greatly reduced (only 5n+6).

Figure 32:
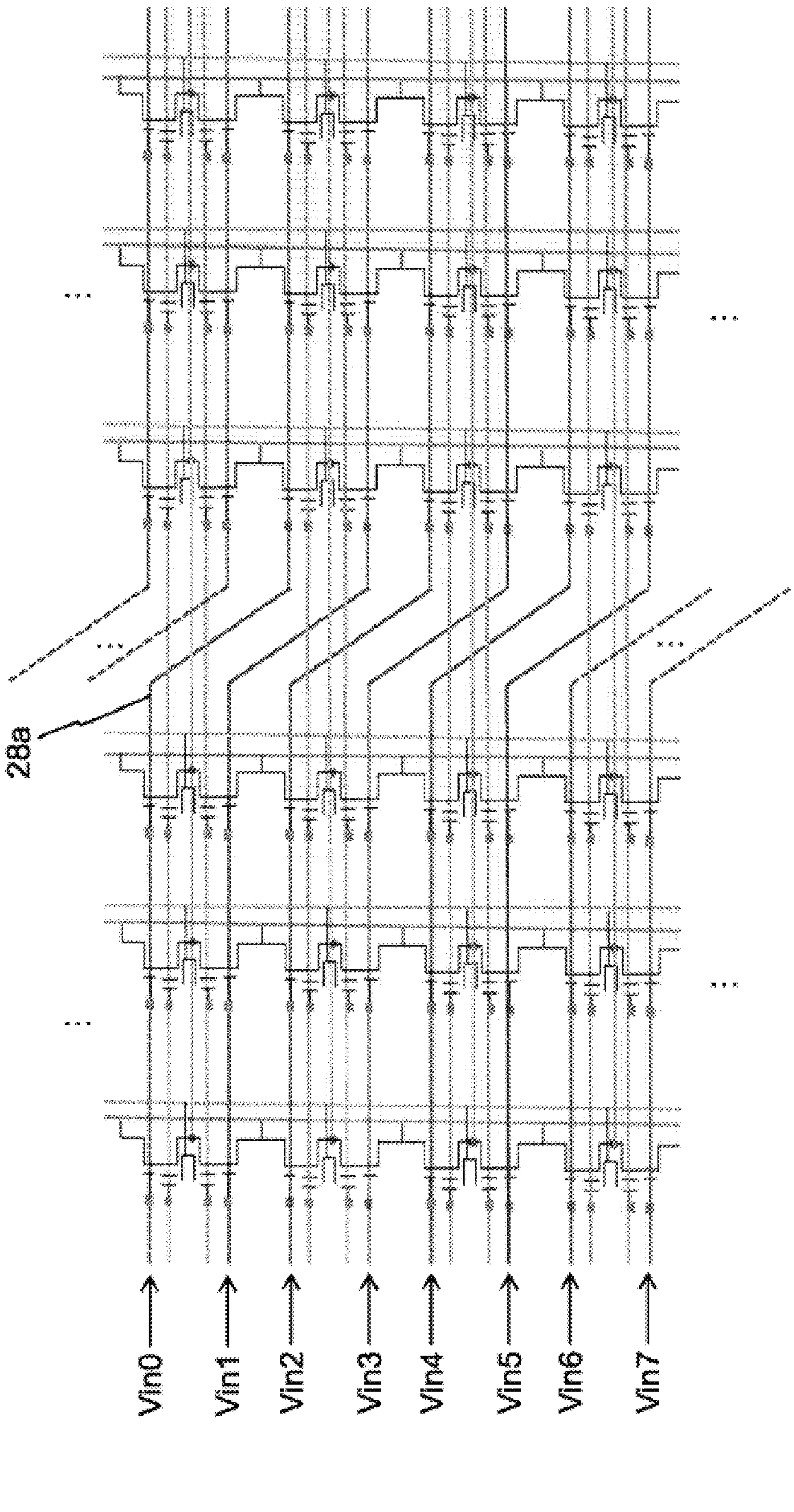
FIG. 32 is a schematic diagram illustrating memory array architecture of FIG. 15, but with periodically shifting input lines.
Figure 33:
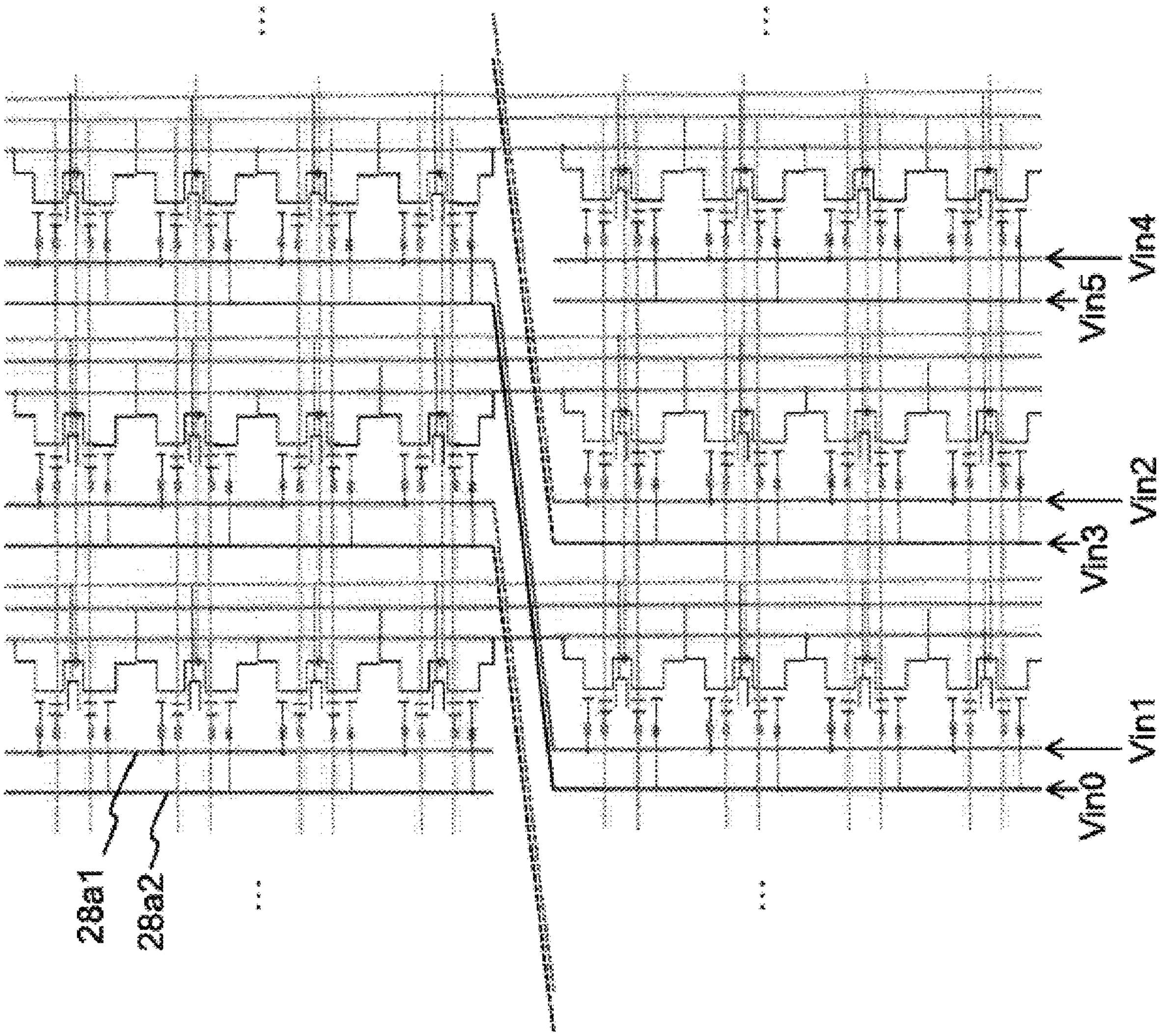
FIG. 33 is a schematic diagram illustrating memory array architecture of FIG. 20, but with periodically shifting input lines.

FIG. 32 illustrates the array of FIG. 15, but with periodic shifts of two rows for lines 28*a* used as the input lines. The periodic shift in rows for the input lines can be similarly implemented in the arrays of FIGS. 17, 22 and 23. FIG. 33 illustrates the array of FIG. 20, but with periodic shifts of two columns for lines 28*a*1 and 28*a*2 used as the input lines. The periodic shift in column for the input lines can be similarly implemented in the arrays of FIGS. 19, 21 and 24.

Improved Tuning Mechanisms and Algorithms

Embodiments for improved tuning mechanisms and algorithms will now be described. Tuning is the process by which the desired amount of charge is verified as being stored in the floating gate of a non-volatile memory cell, that is, to ensure that the non-volatile memory cell is storing the desired value.

Figure 35:
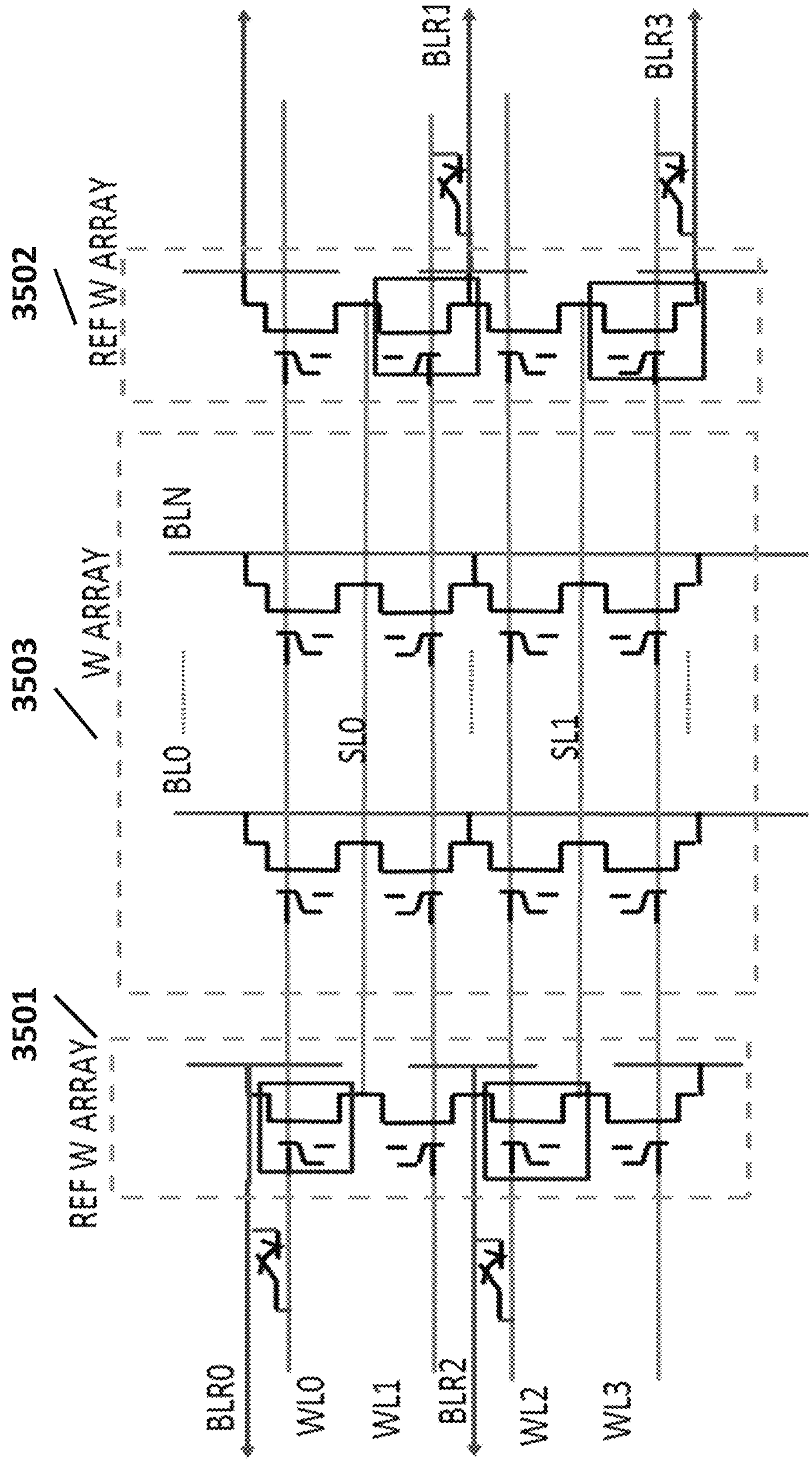
FIG. 35 depicts an array of non-volatile memory cells for use in an artificial neural network.

FIG. 35 depicts neuron VMM 3500, which is particularly suited for memory cells of the type shown in FIG. 2, and is utilized as the synapses between an input layer and the next layer. VMM 3500 comprises a memory array 3503 of non-volatile memory cells, reference array 3501, and reference array 3502. Reference arrays 3501 and 3502 serve to convert current inputs flowing into terminals BLR0-3 into voltage inputs WL0-3. In effect, the reference memory cells are diode connected through multiplexors with current inputs flowing into them. The reference cells are tuned to target reference levels. Memory array 3503 serves two purposes. First, it stores the weights that will be used by the VMM 3500. Second, memory array 3503 effectively multiplies the inputs (current inputs provided in terminals BLR0-3; reference arrays 3501 and 3502 convert these current inputs into the input voltages to supply to wordlines WL0-3) by the weights stored in the memory array to produce the output, which will be the input to the next layer or input to the final layer. By performing the multiplication function, the memory array negates the need for separate multiplication logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 36 depicts operating voltages for VMM 3500. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 37:
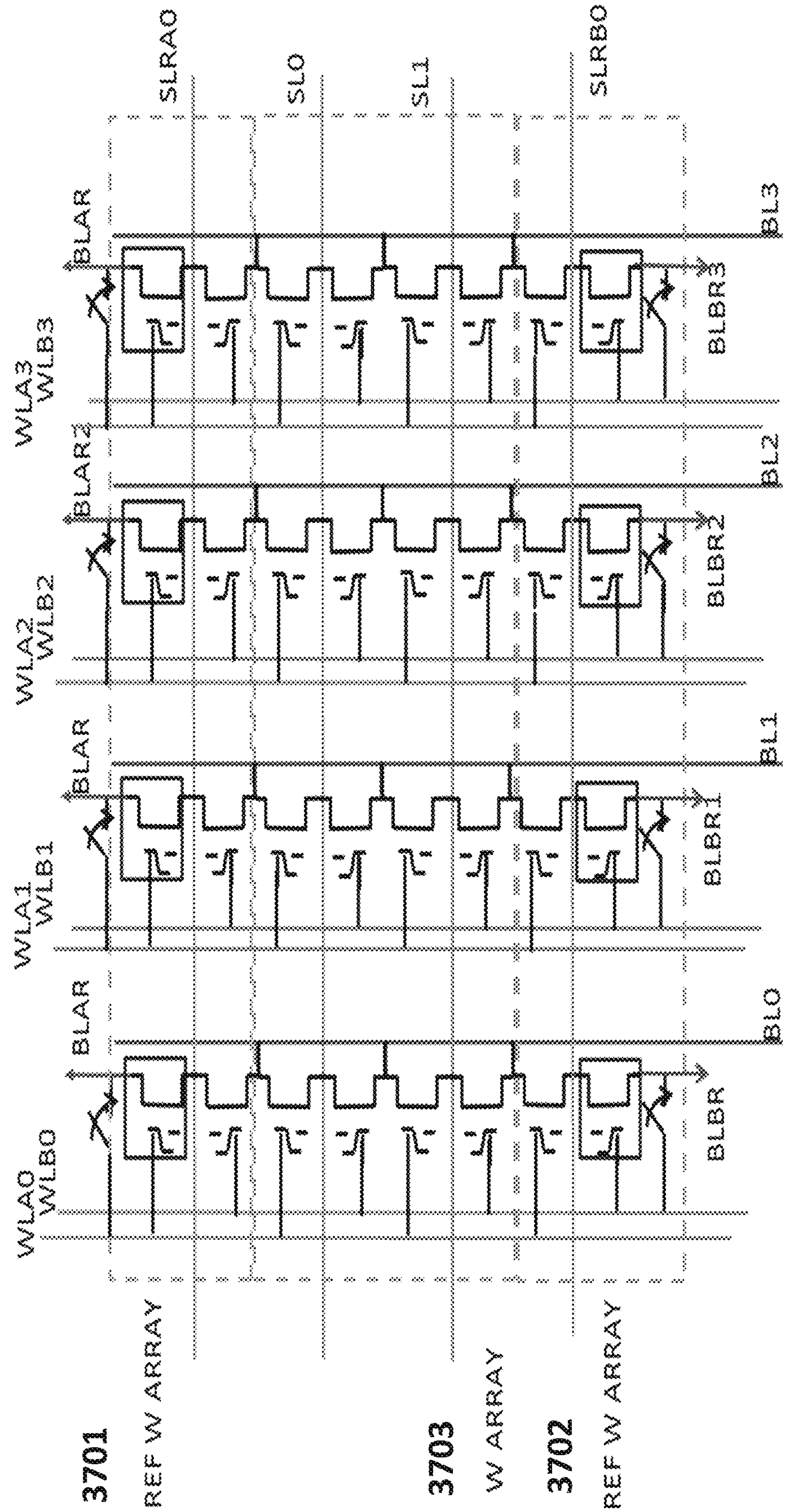
FIG. 37 depicts an array of non-volatile memory cells for use in an artificial neural network.

FIG. 37 depicts neuron VMM 3700, which is particularly suited for memory cells of the type shown in FIG. 2, and is utilized as the synapses between an input layer and the next layer. VMM 3700 comprises a memory array 3703 of non-volatile memory cells, reference array 3701, and reference array 3702. VMM 3700 is similar to VMM 3500 except that in VMM 3700 the word lines run in the vertical direction. Here, the inputs are provided on the word lines, and the output emerges on the source line during a read operation. The current placed on the source line performs a summing function of all the currents from the memory cells connected to the source line.

FIG. 38 depicts operating voltages for VMM 3700. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 39:
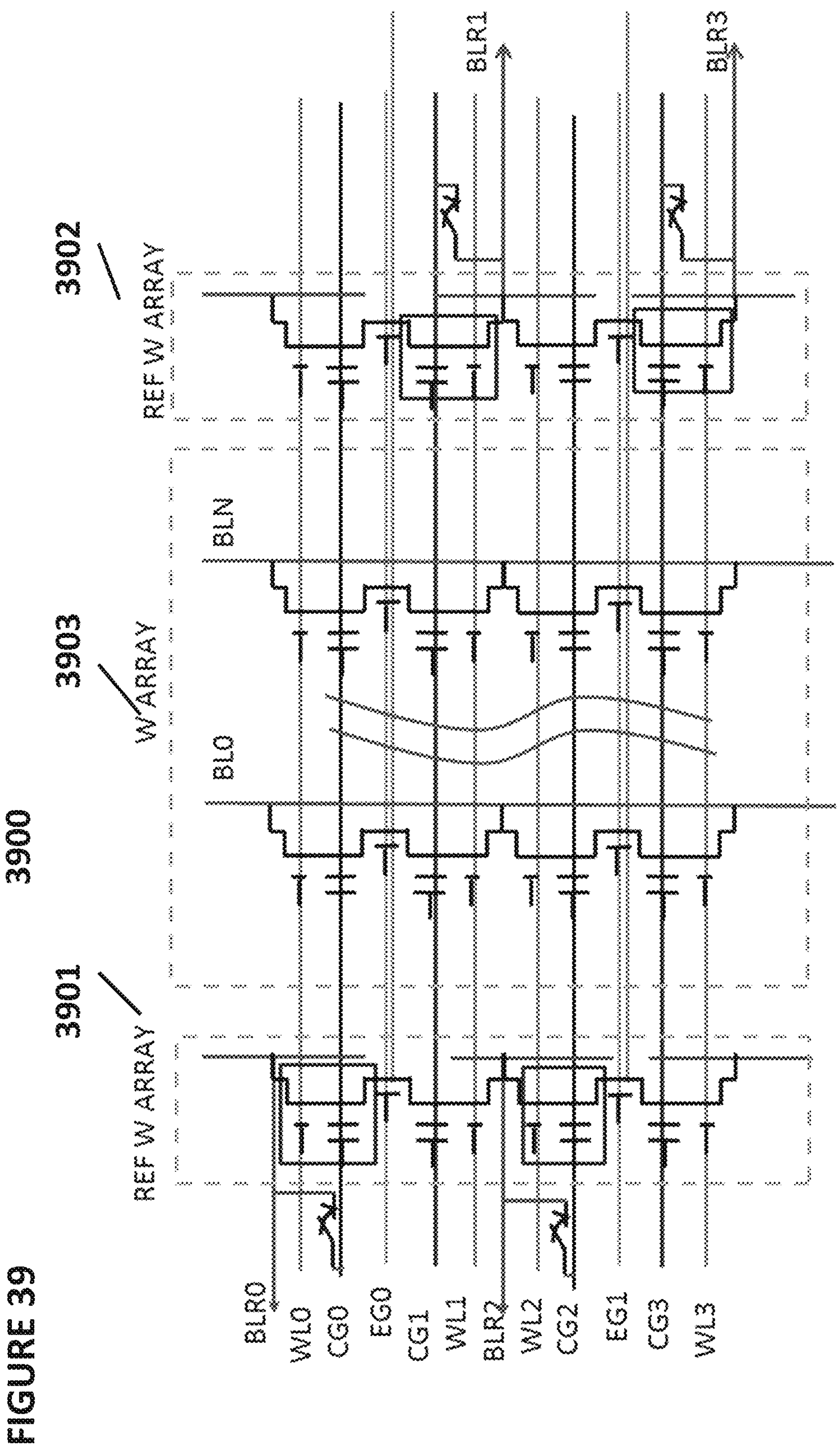
FIG. 39 depicts an array of non-volatile memory cells for use in an artificial neural network.

FIG. 39 depicts neuron VMM 3900, which is particularly suited for memory cells of the type shown in FIG. 6, and is utilized as the synapses between an input layer and the next layer. VMM 3900 comprises a memory array 3903 of non-volatile memory cells, reference array 3901, and reference array 3902. The reference array 3901 and 3902 serves to convert current inputs flowing into terminals BLR0-3 into voltage inputs CG0-3. In effect, the reference memory cells are diode connected through mulitplexors with current inputs flowing into them. The reference cells are tuned to target reference levels. Memory array 3903 serves two purposes. First, it stores the weights that will be used by the VMM 3900. Second, memory array 3903 effectively multiplies the inputs (current inputs provided to terminals BLR0-3; reference arrays 3901 and 3902 convert these current inputs into the input voltages to supply to the control gates CG0-3) by the weights stored in the memory array to produce the output, which will be the input to the next layer or input to the final layer. By performing the multiplication function, the memory array negates the need for separate multiplication logic circuits and is also power efficient. Here, the inputs are provided on the word lines, and the output emerges on the bitline during a read operation. The current placed on the bitline performs a summing function of all the currents from the memory cells connected to the bitline.

VMM 3900 implements uni-directional tuning for memory cells in memory array 3903. That is, each cell is erased and then partially programmed until the desired charge on the floating gate is reached. If too much charge is placed on the floating gate (such that the wrong value is stored in the cell), the cell must be erased and the sequence of partial programming operations must start over. As shown, two rows sharing the same erase gate need to be erased together (to be known as a page erase), and thereafter, each cell is partially programmed until the desired charge on the floating gate is reached, FIG. 40 depicts operating voltages for VMM 3900. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 41:
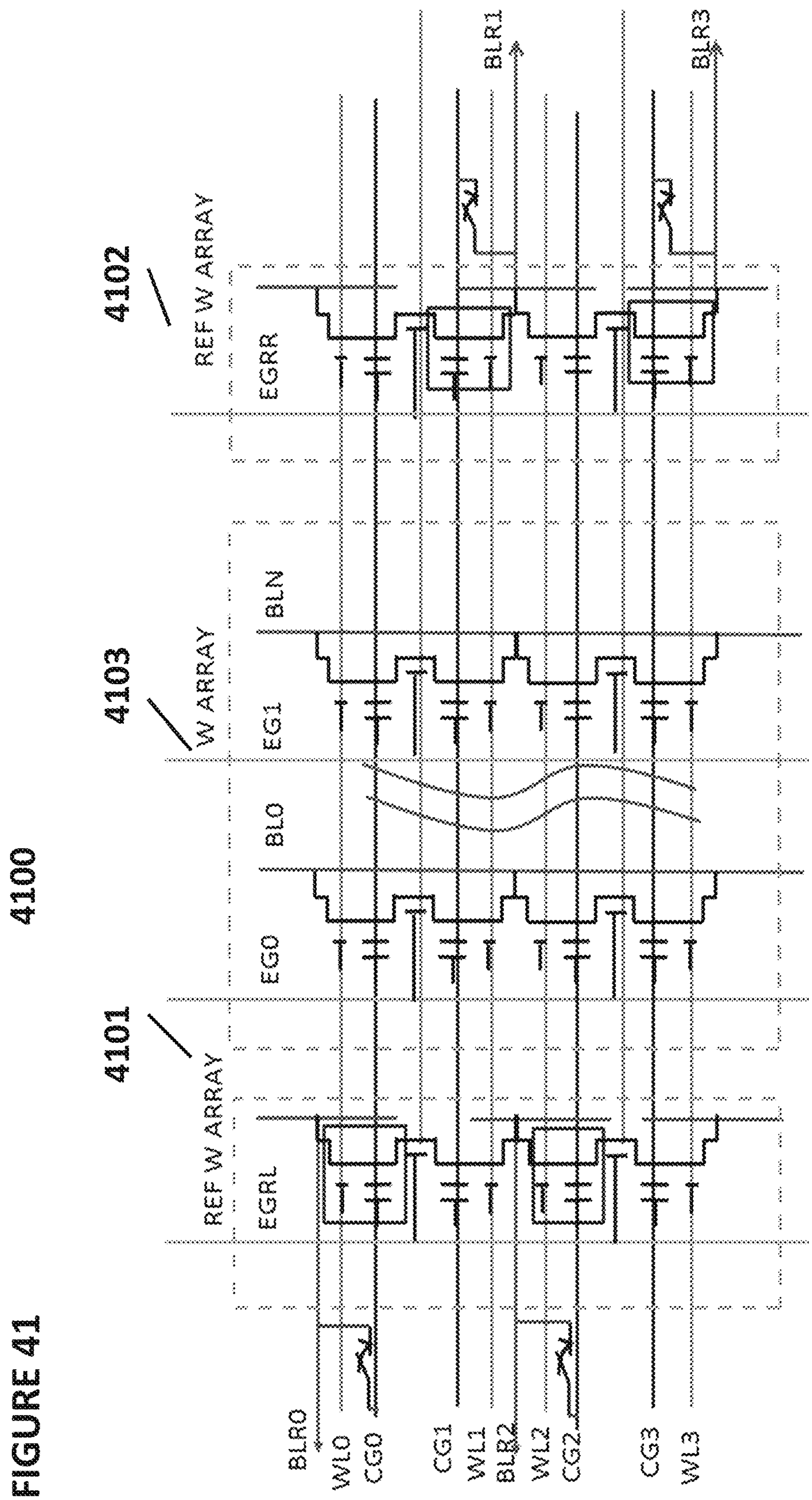
FIG. 41 depicts an array of non-volatile memory cells for use in an artificial neural network.

FIG. 41 depicts neuron VMM 4100, which is particularly suited for memory cells of the type shown in FIG. 6, and is utilized as the synapses between an input layer and the next layer. VMM 4100 comprises a memory array 4103 of non-volatile memory cells, reference array 4101, and reference array 4102. VMM 4100 is similar to VMM 3900, except that VMM 4100 implements bi-directional tuning, where each individual cell can be completely erased, partially programmed, and partially erased as needed to reach the desired amount of charge on the floating gate. As shown, reference arrays 4101 and 4102 convert input current in the terminal BLR0-3 into control gate voltages CG0-3 (through the action of diode-connected reference cells through multiplexors) to be applied to the memory cells in the row direction. The current output (neuron) is in the bitline which sums all currents from the memory cells connected to the bitline.

FIG. 42 depicts operating voltages for VMM 4100. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 43:
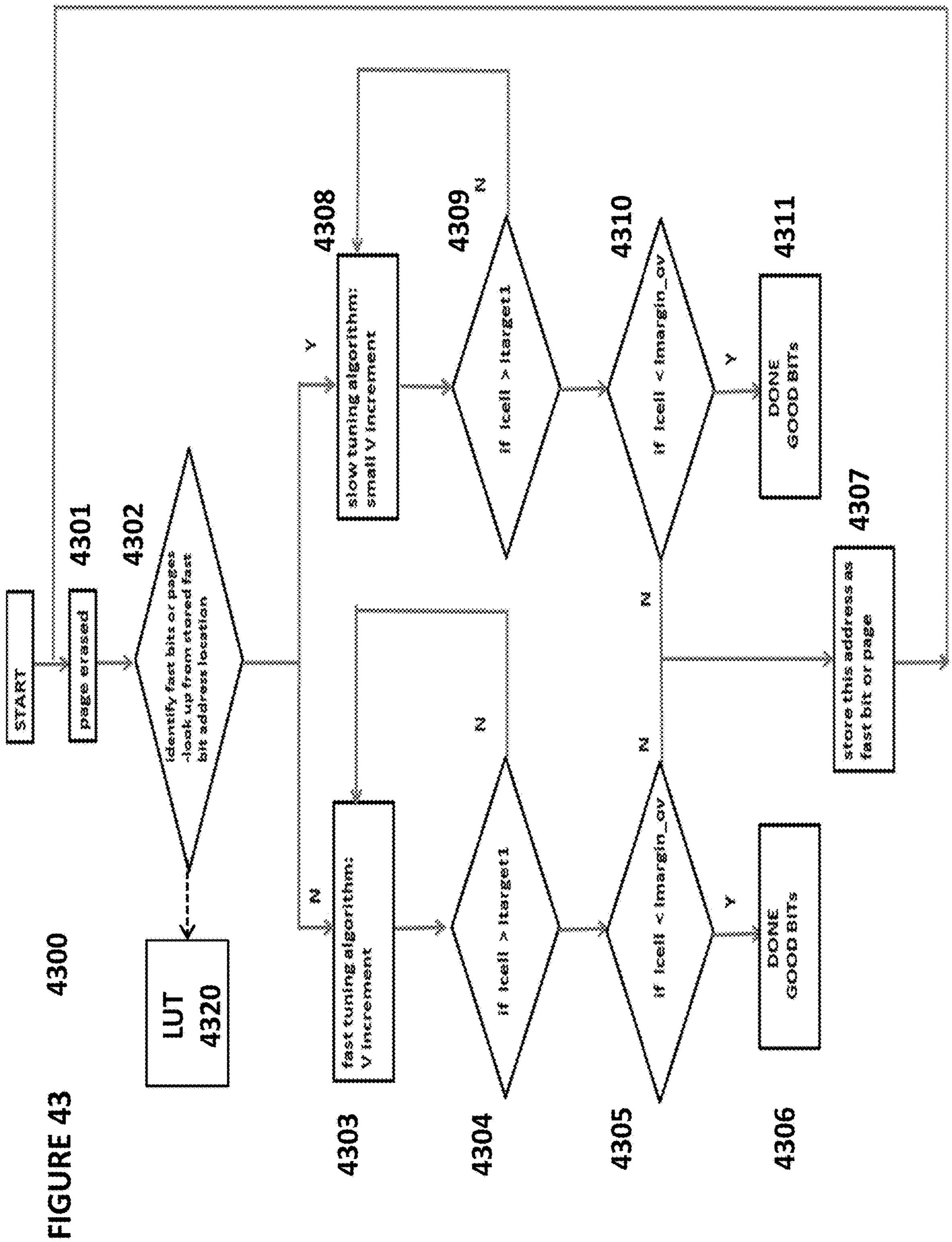
FIG. 43 depicts an algorithm for tuning cells with different programming speed characteristics within an array of non-volatile memory cells.

FIG. 43 depicts tuning algorithm 4300. Tuning algorithm 4300 recognizes that individual memory cells can be fast or slow. A fast cell is one that can be programmed quickly, whereas a slow cell or a normal cell is one that takes a greater amount of time to achieve the same state during a program operation compared to the fast cell. This difference is due to the physics of the individual cell characteristics and variances.

Tuning algorithm 4300 comprises the following sequence of steps. First, a page of memory cells is erased (step 4301). The system then determines which cells in the memory array are fast cells based on look-up table 4320 that was populated during a configuration sequence and that can be updated during operation if the characteristics for a cell change (from fast to slow or slow to fast) (step 4302). Look-up table 4320 might include, for instance, a list of addresses of all fast non-volatile memory cells. Or it might contain an entry for each cell in the array, and the entry might be a single bit where a "1" indicates a fast cell and a "0" indicates a slow normal cell.

If a cell is a fast cell, a fast tuning algorithm is implemented, where a relatively large charge is added to the floating gate of the fast cell through a partial programming operation (step 4303). After each partial programming operation, a verify sequence is performed to determine if Icell through the cell in a read operation is greater than Itarget 1 (step 4304). If no, then the partial programming operation is performed again. If yes, then it is determined if Icell<Imargin_0V (step 4305). If yes, then the desired state has been achieved in the memory cell and the tuning sequence is completed (step 4306). If not, then the cell has been programmed faster than intended, and it is marked in look-up table 4320 as a fast cell (step 4307). Because too much charge has been placed on the floating gate, the cell is not used, and it must again be erased (step 4302).

If the conclusion of step 4302 is that a cell is slow cell, a low tuning algorithm is implemented, where a smaller charge is added to the floating gate of the slow cell through a partial programming operation (step 4308). After each partial programming operation, a verify sequence is performed to determine if Icell through the cell in a read operation is greater than Itarget 1 (step 4309). If no, then the partial programming operation is performed again. If yes, then it is determined if Icell<Imargin_0V (step 4310). If yes, then the desired state has been achieved in the memory cell and the tuning sequence is completed (step 4311). If not, then the cell has been programmed faster than intended, and it is marked in look-up table 4320 as a fast cell (step 4307). Because too much charge has been placed on the floating gate, the cell is not used, and it must again be erased (step 4302). The fast tuning algorithm can be implemented with a large write (e.g., program) voltage increment or wide write pulse width, The low tuning algorithm can be implemented with a small write voltage increment or a narrow write pulse width.

Figure 44:
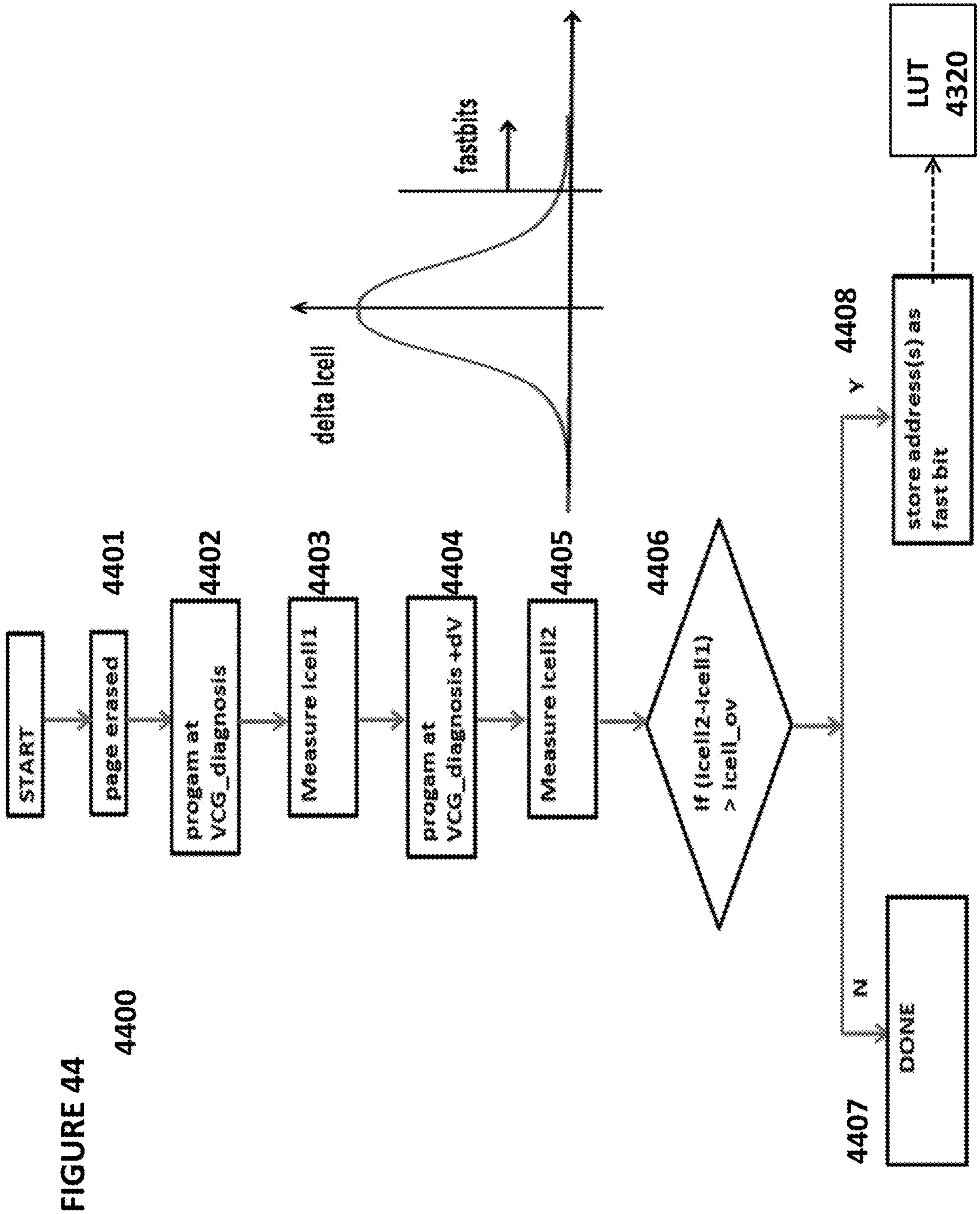
FIG. 44 depicts an algorithm for identifying cells that can be programmed quickly within an array of non-volatile memory cells.

FIG. 44 depicts tuning algorithm 4400. Tuning algorithm 4400 can be used during a configuration sequence to identify the cells in a memory array that are fast cells. Tuning algorithm 4400 comprises the following sequence of steps. A page is erased (step 4401). A cell is programmed at a voltage VCG_diagnosis (step 4402). The current, Icell1, is measured through the cell during a read operation (step 4403). The cell is programmed at a voltage VCG_diagnosis+d V (step 4404). The current, Icell2, is measured through the cell during a read operation (step 4405). A determination is made as to whether the difference between Icell2 and Icell1 exceeds Icell_0V (step 4406). If no, then the cell is a normal or slow cell (step 4407). If yes, then the cell is a fast cell, and it is identified as a fast cell in look-up table 4320 (step 4408). As shown in the graph contained in FIG. 44, a fast cell will accumulate charge on its floating gate in response to step 4404. The incremental programming voltage d is a small voltage and will not affect the accumulated charge for normal or slow cells. That is, fast cells accumulate charge on their floating gates in response to relatively small programming voltages. Alternatively, two erase pulses can be used to extract the delta current of memory cells that fall into the fast bit region. In this case, all of the cells are deeply programmed first.

Figure 45:
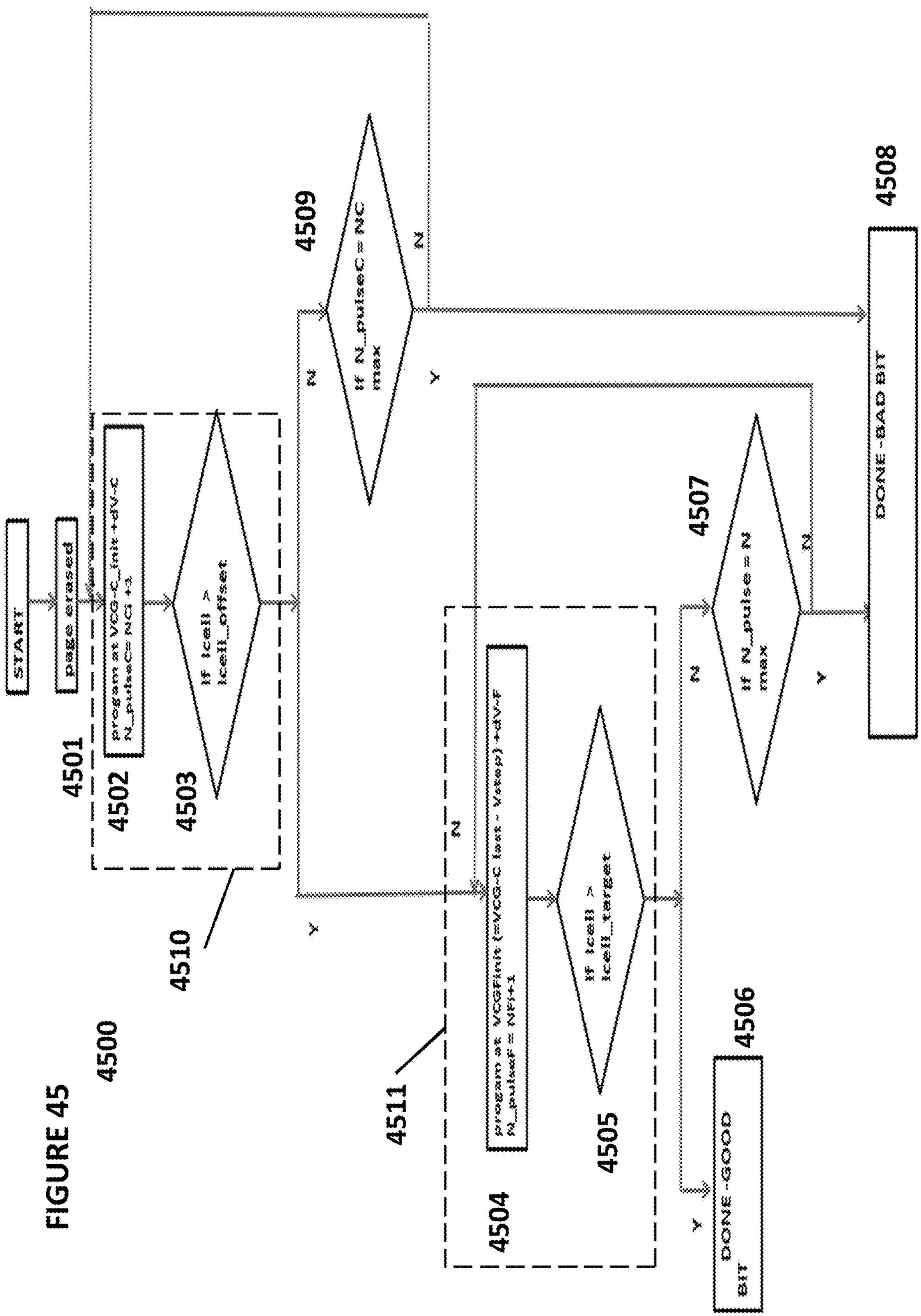
FIG. 45 depicts an algorithm for tuning cells comprising a coarse programming sequence and a fine programming sequence.

FIG. 45 depicts tuning algorithm 4500. Tuning algorithm 4500 combines a coarse algorithm 4510 (where a cell is programmed in relatively large increments) and a fine algorithm 4511 (where the cell is programmed in relatively small increments). This minimizes the occurrence of overshooting the desired voltage and increases the overall speed of the system.

Tuning algorithm 4500 comprises the following sequence of steps. A page is erased (step 4501). Coarse algorithm 4510 is then performed, which comprises steps 4502 and 4503. A cell is programmed at VCG-C_init+dV-C, N_pulseC=NCi+1 (step 4502). The current, Icell, is measured through the cell during a read operation, and a determination is made as to whether Icell>Icell_offset (step 4503). If yes, then fine algorithm 4511 begins, which comprises steps 4504 and 4505. The cell is programmed at VCGFiniti (=VCG-C last−Vstep)+dV-F, N_pulseF=NFi+1 (step 4504). The current, Icell, is measured through the cell during a read operation, and a determination is made as to whether Icell>Icell_target (step 4505). If yes, then the desired charge has been achieved and the tuning process is complete (step 4506). If no, then it is determined if f N_pulseF=N max (step 4507). If yes, then the cell is determined to be a bad cell and is marked as such in a look-up table (step 4508). If no, then step 4504 is repeated. If the result of step 4503 is no, then it is determined if N_pulseC=NCmax (step 4509). If yes, then the cell is determined to be a bad cell and is marked as such in a look-up table (step 4508). If no, then step 4502 is repeated. Alternatively, wide write pulsewidth can be used instead of coarse voltage level, and narrow write pulsewidth can be used instead of fine voltage level.

Additional detail regarding the tuning operations of FIGS. 43 and 45 will now be described with reference to FIGS. 46-50.

FIG. 46 depicts exemplary values for uniform step algorithm 4600. In this example, the approximate program target voltage is 8V. This target voltage is, for example, extracted from a look-up table or a model of current target Itarget versus target programming voltage. The cell is initially programmed at 4V. Thereafter, fine programming comprises programming in step sizes of 0.01V, with a maximum number of steps of 400.

FIG. 47 depicts exemplary values for uniform log step (divided by ten), coarse/fine algorithm 4700. In this example, the approximate program target voltage is 8V. The cell is initially programmed at 4V. Thereafter, coarse programming comprises programming in log step sizes of 0.4V (=4V/10), with a maximum number of steps of 10. Thereafter, a first fine programming sequence occurs, where a partial erase operation to reduce the voltage of the floating gate by 0.2V, and thereafter, programming occurs in step sizes of 0.1 V, with a maximum number of steps of 6. Then a second fine programming sequence occurs, where a partial erase operation occurs of 0.1V, and thereafter, programming occurs in log step sizes of 0.01V (=0.1V/10), with a maximum number of steps of 20. Thus, the total number of pulses is 46.

FIG. 48 depicts binary search step, coarse/fine algorithm 4800. In this example, the approximate program target voltage again is 8V. The cell is initially programmed at 4V. Thereafter, coarse programming occurs in steps where the delta programming voltage is divided by two, namely 2V, 1V, 0.5V, 0.25V, 0.125V, and 0.625V. Thereafter, an erasing step is performed to reduce the voltage of the floating gate by 0.0625V, and thereafter, fine programming occurs in a fixed increments of 0.01V with a maximum number of steps of 19. This total number of pulses is 25.

Figure 49:
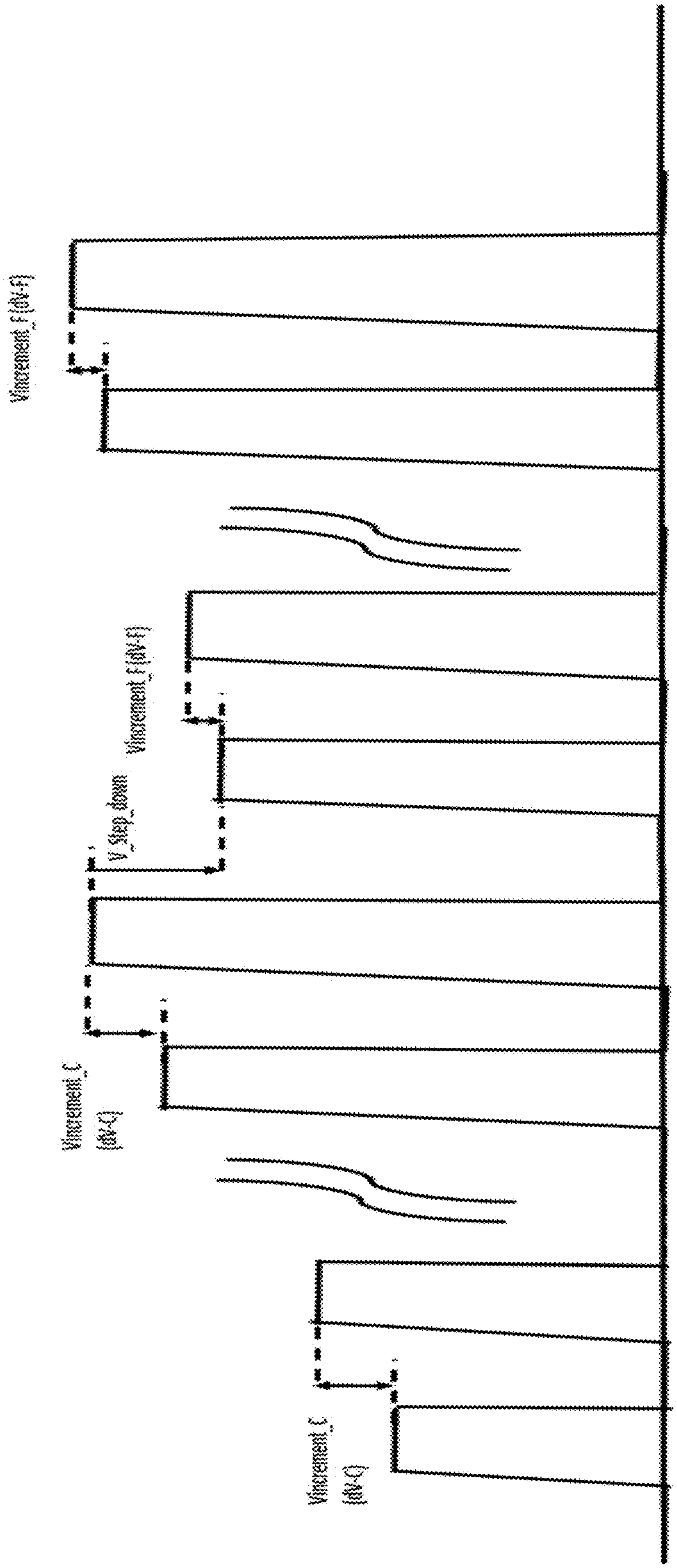
FIG. 49 depicts a waveform of a tuning sequence for a non-volatile memory cell.

FIG. 49 depicts an exemplary waveform of algorithm 4800. As can be seen, coarse programming increased the voltage until Icell exceeds a threshold. Then a voltage step down is performed to reduce the voltage by 0.0625V, and thereafter, fine programming occurs. The step down is to avoid the potential program overshoot for the next programming pulse.

Figure 50:
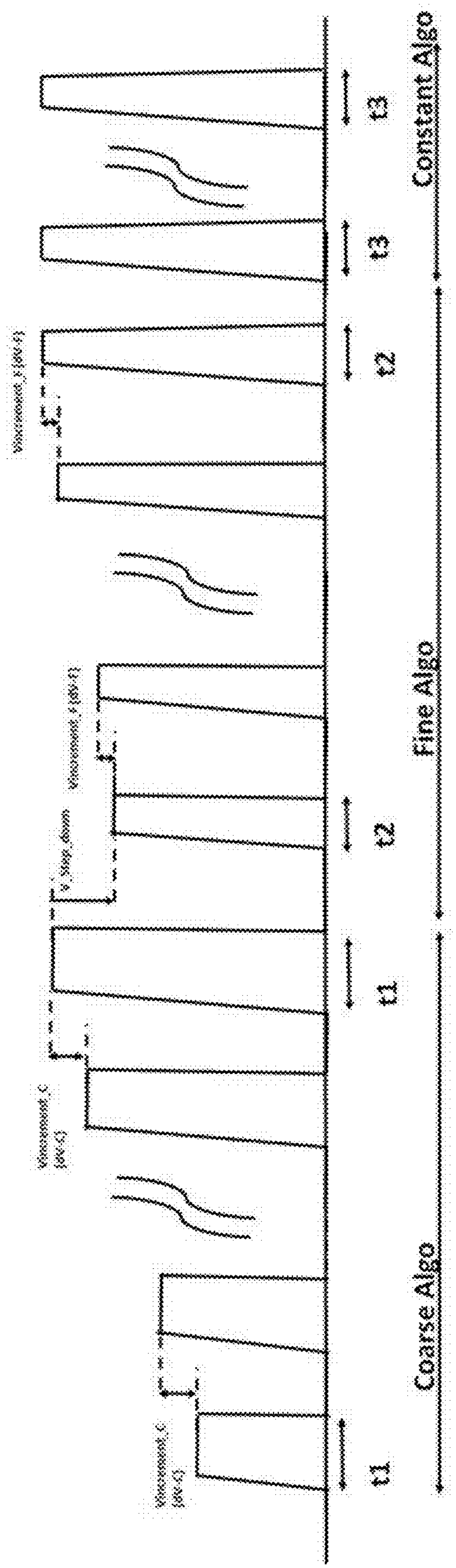
FIG. 50 depicts a waveform of a tuning sequence for a non-volatile memory cell.

FIG. 50 depicts another exemplary waveform for the coarse-fine algorithms described herein. First, coarse programming occurs. Second, fine programming occurs. Third, once the appropriate voltage is achieved, the total amount of programming charge is recorded and/or the steps recorded, so that thereafter, the appropriate programming level can be achieved with a single constant voltage programming operation at the desired accurate charge. Alternatively, the tuning algorithm can consist of coarse pulses consisting of wide pulse-width and/or a large voltage increment and fine pulses consisting of constant pulse-width and/or constant voltage pulses.

In alternative embodiments, the embodiments of FIGS. 15, 16, 17, 18, 19, 20, 21, 22, 25, 26, 32, and 33 can be modified such that the inputs are the control gates instead of the select gates (wordlines). Similarly, the embodiments of FIGS. 39 and 41 can be modified such that the inputs are the select gates (word lines) instead of control gates.

It should be noted that, as used herein, the terms “over” and “on” both inclusively include “directly on” (no intermediate materials, elements or space disposed therebetween) and “indirectly on” (intermediate materials, elements or space disposed therebetween). Likewise, the term “adjacent” includes “directly adjacent” (no intermediate materials, elements or space disposed therebetween) and “indirectly adjacent” (intermediate materials, elements or space disposed there between), “mounted to” includes “directly mounted to” (no intermediate materials, elements or space disposed there between) and “indirectly mounted to” (intermediate materials, elements or spaced disposed there between), and “electrically coupled” includes “directly electrically coupled to” (no intermediate materials or elements there between that electrically connect the elements together) and “indirectly electrically coupled to” (intermediate materials or elements there between that electrically connect the elements together). For example, forming an element “over a substrate” can include forming the element directly on the substrate with no intermediate materials/elements therebetween, as well as forming the element indirectly on the substrate with one or more intermediate materials/elements there between.

What is claimed is:

1. A method for tuning a plurality of non-volatile analog neuromorphic memory cells, comprising:
   erasing the plurality of non-volatile analog neuromorphic cells; and
   performing a tuning algorithm on each of the plurality of non-volatile analog neuromorphic memory cells, the tuning algorithm comprising:
      determining a first current threshold for the cell, wherein the first current threshold is related to a desired weight level to be stored in the cell;
      determining a second current threshold, wherein the second current threshold is equal to the first current threshold minus an offset value;
      performing a coarse programming sequence on the cell, comprising:
         performing a coarse programming operation on the cell by applying a coarse programming voltage to a terminal of the cell; and
         repeating the coarse programming operation until the current through the cell during a read operation exceeds the second current threshold, wherein each time the programming operation is repeated the coarse programming voltage is increased by a predetermined coarse increment; and
      performing a fine programming sequence on the cell, comprising:
         performing a fine programming operation on the cell by applying a fine programming voltage to a terminal of the cell, wherein the fine programming voltage is equal to the last coarse programming voltage applied minus an offset; and
         repeating the fine programming operation until the current through the cell during a read operation exceeds the first current threshold, wherein each time the fine programming operation is repeated the fine programming voltage is increased by a predetermined fine increment, wherein each predetermined fine increment is smaller than each predetermined coarse increment.

2. The method of claim 1, further comprising:
   performing a second fine programming sequence on the cell, comprising;
      performing a second fine programming operation on the cell by applying a second fine programming voltage to a terminal of the cell, wherein the second fine programming voltage is equal to the last fine programming voltage applied minus an offset;
      repeating the second fine programming operation until the current through the cell during a read operation exceeds the first current threshold, wherein each time the second fine programming operation is repeated the second fine programming voltage is increased by a predetermined second fine increment, wherein each predetermined second fine increment is smaller than each predetermined fine increment.

3. The method of claim 1, wherein the predetermined coarse increments are binary search steps.

4. The method of claim 1, wherein the predetermined coarse increments are uniform steps.

5. The method of claim 1, wherein the pulse width of the coarse programming is larger than the pulse width of the fine programming.

6. The method of claim 1, wherein the programming includes fixed pulse width programming.

7. The method of claim 1, wherein the memory cell is a split 2-gate flash memory cell.

8. The method of claim 1, wherein the memory cell is a split 3-gate flash memory cell.

9. The method of claim 1, wherein the memory cell is a split 4-gate flash memory cell.

10. The method of claim 1, wherein the memory cell operates in a subthreshold region.

* * * * *